US012696812B2

(12) United States Patent
Kikuchi et al.

(10) Patent No.: US 12,696,812 B2
(45) Date of Patent: Jul. 28, 2026

(54) SEMICONDUCTOR DEVICE

(71) Applicant: ROHM CO., LTD., Kyoto (JP)

(72) Inventors: Tomohira Kikuchi, Kyoto (JP); Hiroaki Matsubara, Kyoto (JP); Yoshizo Osumi, Kyoto (JP); Moe Yamaguchi, Kyoto (JP); Ryohei Umeno, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 328 days.

(21) Appl. No.: 18/352,759

(22) Filed: Jul. 14, 2023

(65) Prior Publication Data

US 2024/0030212 A1     Jan. 25, 2024

Related U.S. Application Data

(63) Continuation of application No. PCT/JP2022/000250, filed on Jan. 6, 2022.

(30) Foreign Application Priority Data

Jan. 19, 2021     (JP) ................................ 2021-006268

(51) Int. Cl.
*H10W 90/00*          (2026.01)
*H10W 70/40*          (2026.01)
(Continued)

(52) U.S. Cl.
CPC ......... *H10W 90/00* (2026.01); *H10W 70/429* (2026.01); *H10W 74/114* (2026.01); (Continued)

(58) Field of Classification Search
None
See application file for complete search history.

(56) References Cited

U.S. PATENT DOCUMENTS

2012/0020419 A1* 1/2012 Kaeriyama ......... H04L 25/4902
                                                            375/259
2019/0273066 A1* 9/2019 Kuwabara ........... H01L 25/0657

FOREIGN PATENT DOCUMENTS

JP          2012-227314          11/2012
JP          2012227314 A   * 11/2012
                    (Continued)

OTHER PUBLICATIONS

International Search Report and Written Opinion issued in International Application No. PCT/JP2022/000250, Mar. 15, 2022, 5 pages.
(Continued)

*Primary Examiner* — Sue A Purvis
*Assistant Examiner* — Jordan M Klein
(74) *Attorney, Agent, or Firm* — HSML P.C

(57)          ABSTRACT

A semiconductor device includes a semiconductor control element, a first drive element, a second drive element and a first insulating element. The first drive element is spaced apart from the semiconductor control element in a first direction orthogonal to a thickness direction of the semiconductor control element and receives a signal transmitted from the semiconductor control element. The second drive element is spaced apart from the first drive element in a second direction orthogonal to the thickness direction and the first direction and receives a signal transmitted from the semiconductor control element. The first insulating element is located between the semiconductor control element and the first drive element in the first direction. The first insulating element relays a signal transmitted from the semiconductor control element to the first drive element and provides electrical insulation between the semiconductor control element and the first drive element.

16 Claims, 16 Drawing Sheets

(51) Int. Cl.
    *H10W 72/00*      (2026.01)
    *H10W 72/30*      (2026.01)
    *H10W 74/10*      (2026.01)

(52) U.S. Cl.
    CPC ........ *H10W 90/811* (2026.01); *H10W 70/417*
          (2026.01); *H10W 72/352* (2026.01); *H10W*
          *72/884* (2026.01); *H10W 90/736* (2026.01);
          *H10W 90/753* (2026.01); *H10W 90/756*
          (2026.01); *H10W 90/759* (2026.01)

(56)           References Cited

FOREIGN PATENT DOCUMENTS

| JP | 2013-051547 A2 | 3/2013 |
| JP | 2016-207714 | 12/2016 |
| JP | 2018-022849 | 2/2018 |
| JP | 2019-153685 | 9/2019 |
| WO | 2010/113383 | 10/2010 |

OTHER PUBLICATIONS

Office Action issued in corresponding Japanese Patent Application No. 2022-576596, Oct. 14, 2025, 10 pages w/ translation.
Notice of Reasons for Refusal issued in corresponding Japanese Patent Application No. 2022-576596, Mar. 10, 2026, 6 pages w/translation.

* cited by examiner

SEMICONDUCTOR DEVICE

TECHNICAL FIELD

The present disclosure relates to semiconductor devices.

BACKGROUND ART

Conventionally, inverter devices have been used in electric vehicles (including hybrid vehicles) and consumer electronics. An inverter device includes a plurality of power semiconductors, such as insulated gate bipolar transistors (IGBTs) and metal-oxide-semiconductor field-effect transistors (MOSFETs), and a plurality of semiconductor devices incorporating insulating elements and serving as insulated gate drivers for generating drive signals for the power semiconductors. Each semiconductor device (insulated gate driver) includes a semiconductor control element, an insulating element and a drive element. A control signal issued from an engine control unit (ECU) to the inverter device is inputted to the semiconductor control element of a semiconductor device. The semiconductor control element converts the control signal to a pulse width modulation (PWM) control signal, which is then transmitted to the drive element via the insulating element. The drive element generates a drive signal based on the PWM control signal and inputs the resulting signal to a power semiconductor to switch the power semiconductor on and off with desired timing. By switching, for example, six power semiconductors on and off with desired timing, three-phase AC power for driving the motor is generated from the DC power fed from a vehicle-mounted battery. JP-A-2016-207714 discloses an example of a semiconductor device that includes an insulating element.

A typical inverter device includes a plurality of half-bridge circuits each composed of two power semiconductors. Each power semiconductor in a half-bridge circuit receives a drive signal. Since the semiconductor device disclosed in JP-A-2016-207714 is for generating a drive signal for one power semiconductor, two such semiconductor devices per half-bridge circuit are mounted on the wiring board of the inverter device. As there is a demand for downsizing inverter devices, the wiring board is desired to be as small as possible.

BRIEF DESCRIPTION OF THE DRAWINGS

Figure 1:
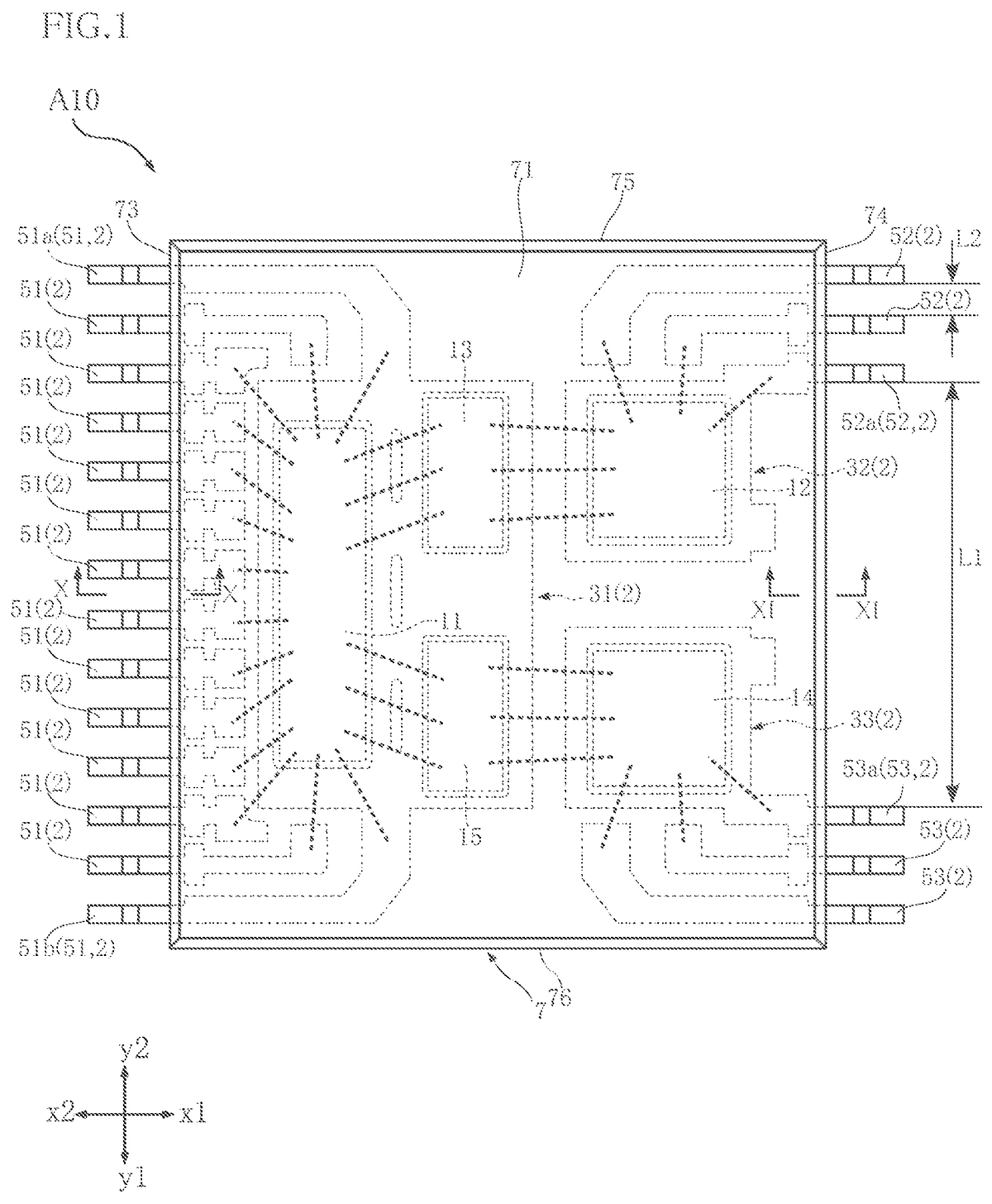

FIG. 1 is a plan view of the semiconductor device according to a first embodiment of the present disclosure.

DETAILED DESCRIPTION OF EMBODIMENTS

Figure 2:
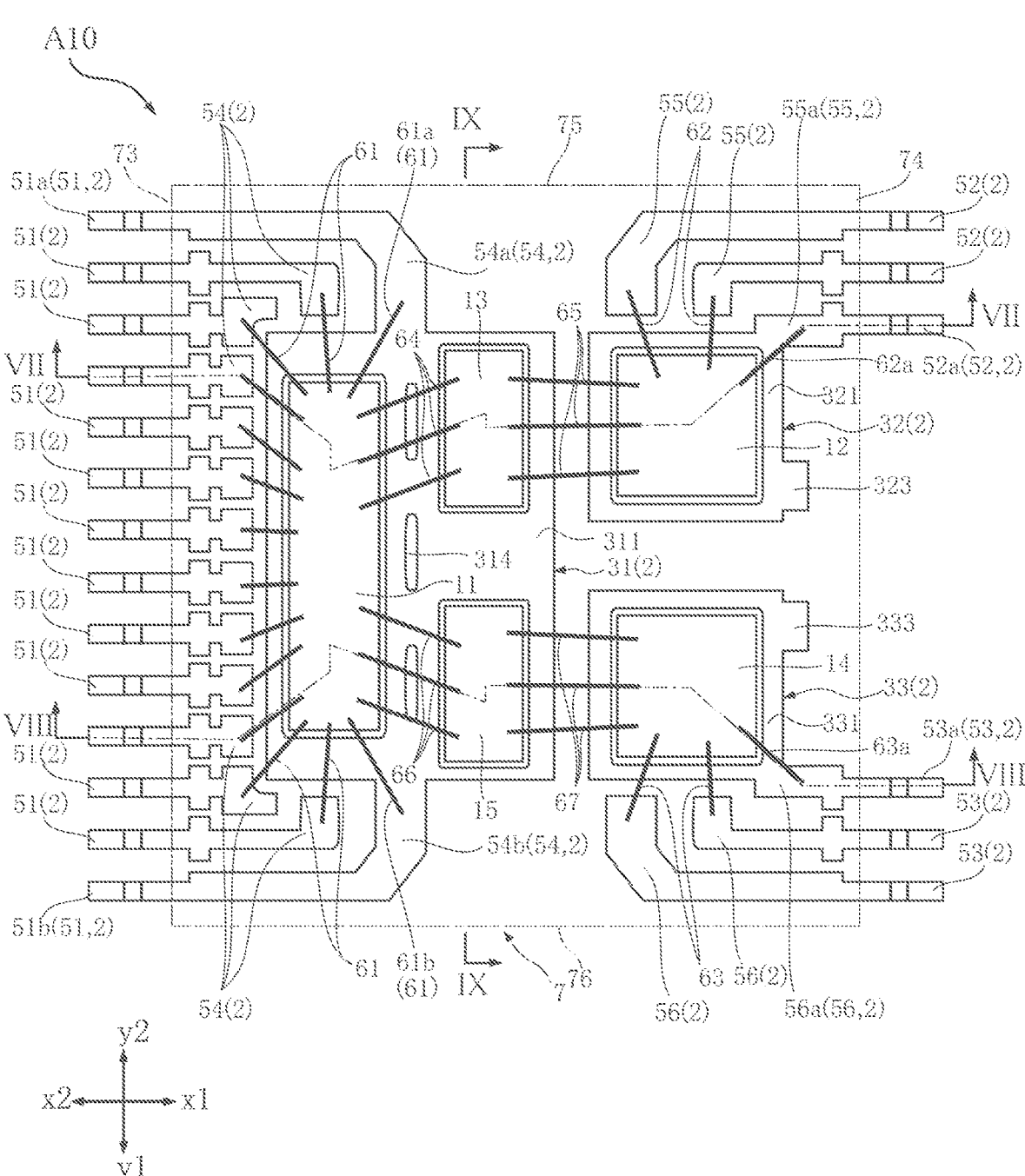
FIG. 2 is a plan view of the semiconductor device of FIG. 1 with a sealing resin shown as transparent.

Hereinafter, preferred embodiments of the present disclosure will be described with reference to the accompanying drawings.

Unless otherwise noted, the phrases such as "an object A is formed in an object B" and "an object A is formed on an object B" used in the present disclosure include "the object A is formed in direct contact with the object B" and "the object A is formed on the object B with another object interposed between the object A and the object B". Similarly, unless otherwise noted, the phrases such as "an object A is arranged in an object B" and "an object A is arranged on an object B" include "the object A is arranged with direct contact with the object B" and "the object A is arranged on the object B with another object interposed between the object A and the object B". Similarly, unless otherwise noted, the phrase such as "an object A is located on an object B" includes "the object A is located on the object B with direct contact between the object A and the object B" and "the object A is located on the object B with another object interposed between the object A and the object B". Additionally, unless otherwise noted, the phrase such as "an object A overlaps with an object B as viewed in a certain direction" includes "the object A overlaps with the entire object B as viewed in the direction" and "the object A overlaps with a portion of the object B as viewed in the direction".

FIGS. 1 to 11 show a semiconductor device according to a first embodiment of the present disclosure. A semiconductor device A10 of the present embodiment includes a semiconductor control element 11, a first drive element 12, a first insulating element 13, a second drive element 14, a second insulating element 15, an electroconductive support member 2, a plurality of wires 61 to 67 and a sealing resin 7. The electroconductive support member 2 includes a first die pad 31, a second die pad 32, a third die pad 33, a plurality of input-side terminals 51, a plurality of first output-side terminals 52, a plurality of second output-side terminals 53 and a plurality of pad portions 54 to 56. The semiconductor device A10 is for surface mounting on the wiring board of an inverter device that is incorporated, for example in, an electric vehicle or a hybrid vehicle. The semiconductor device A10 is not limited to specific applications and/or functions. The semiconductor device A10 is provided in a small outline package (SOP). The packaging of the semiconductor device A10, however, is not limited to SOP.

Figure 3:
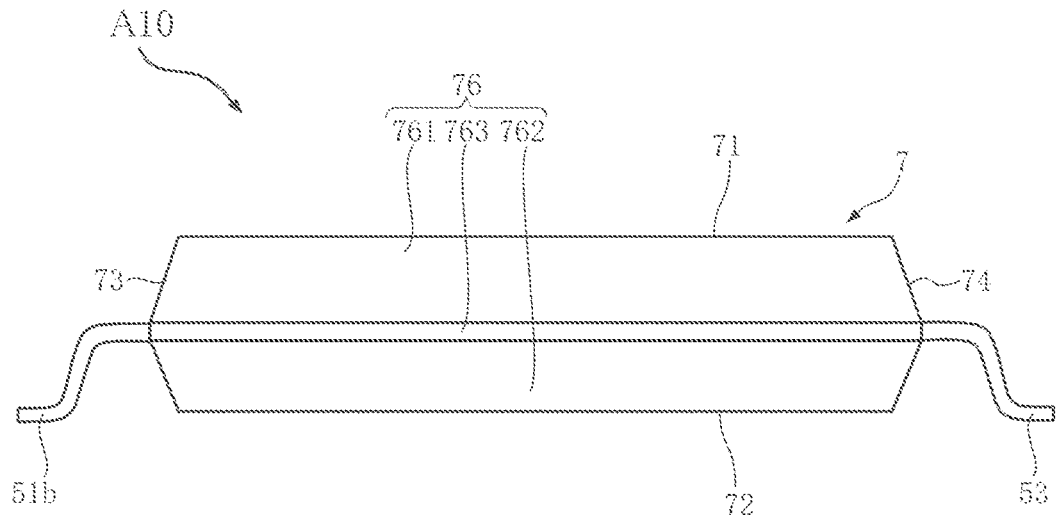
FIG. 3 is a front view of the semiconductor device of FIG. 1.
Figure 3:
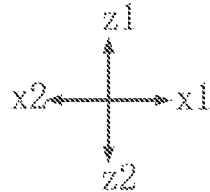
Figure 4:
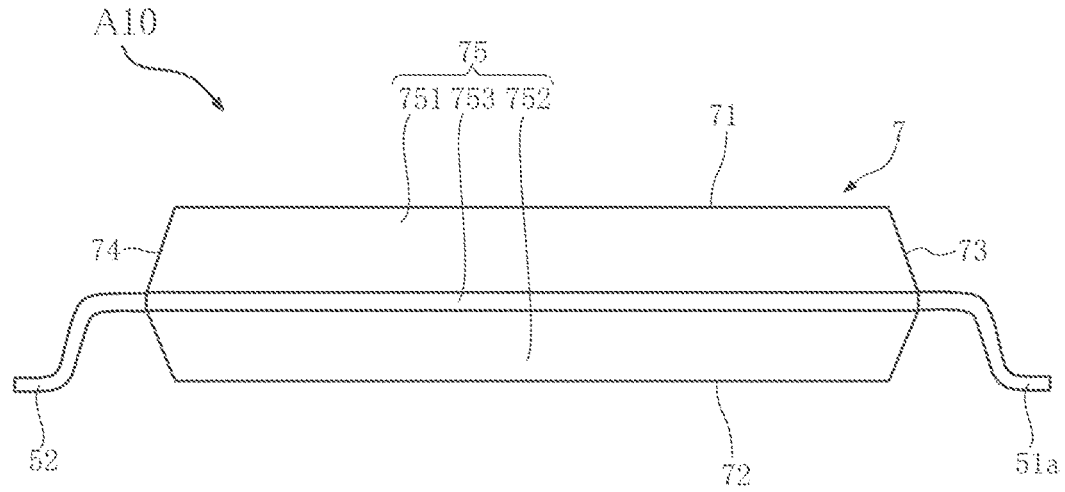
FIG. 4 is a rear view of the semiconductor device of FIG. 1.
Figure 4:
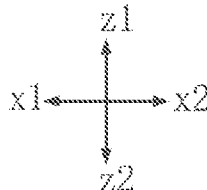
Figure 5:
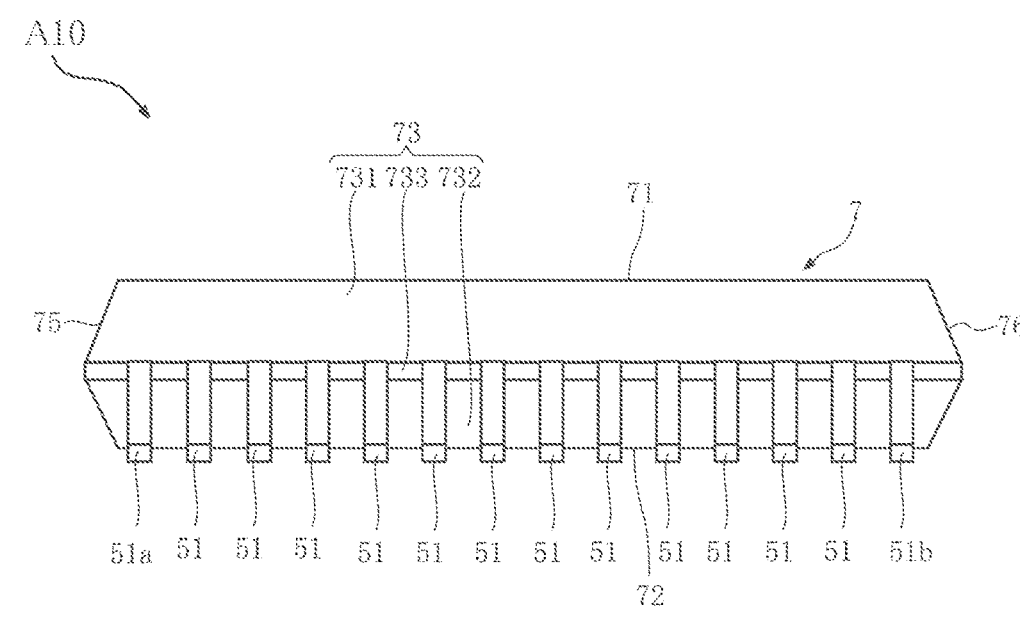
FIG. 5 is a left-side view of the semiconductor device of FIG. 1.
Figure 5:
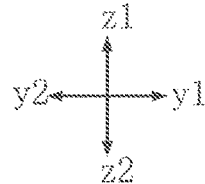
Figure 6:
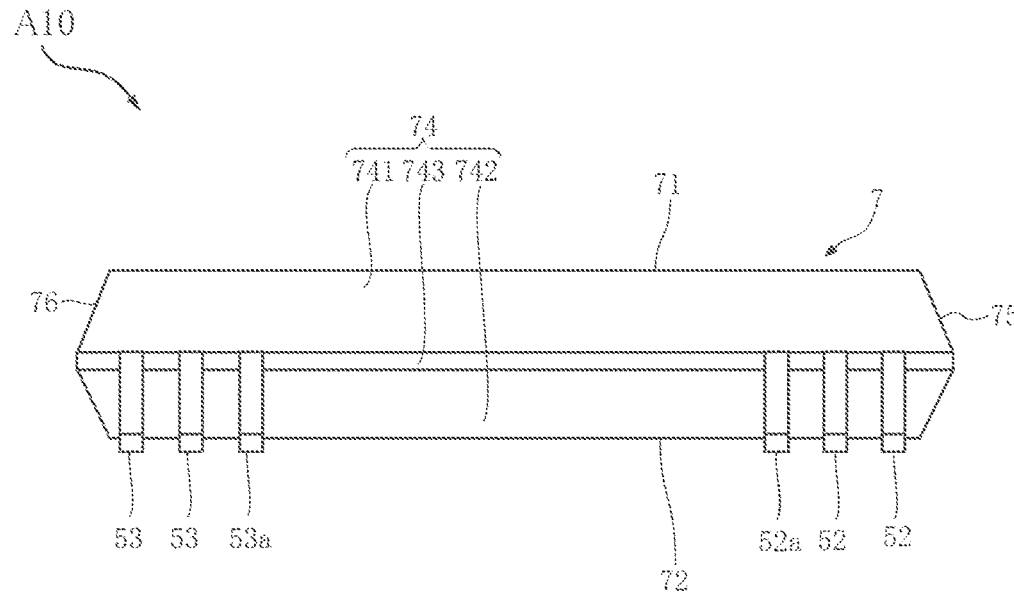
FIG. 6 is a right-side view of the semiconductor device of FIG. 1.
Figure 6:
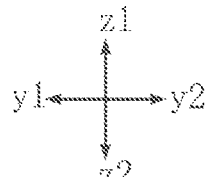
Figure 7:
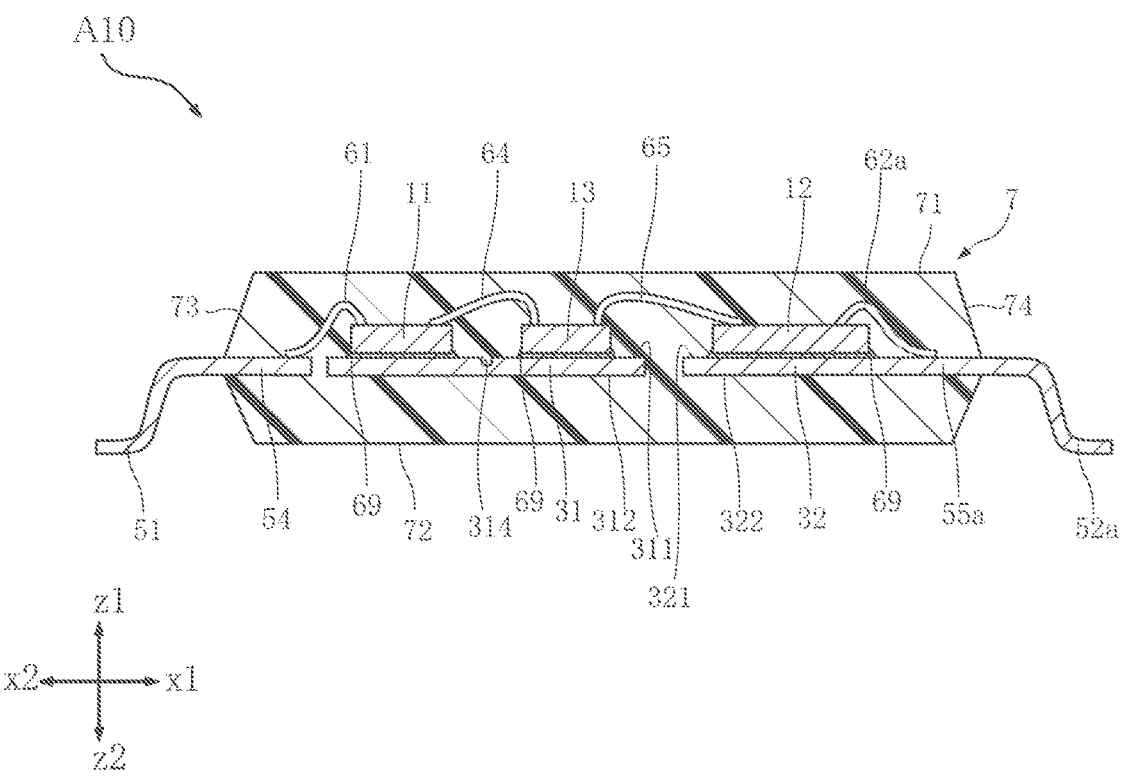
FIG. 7 is a sectional view taken along line VII-VII of FIG. 2.
Figure 8:
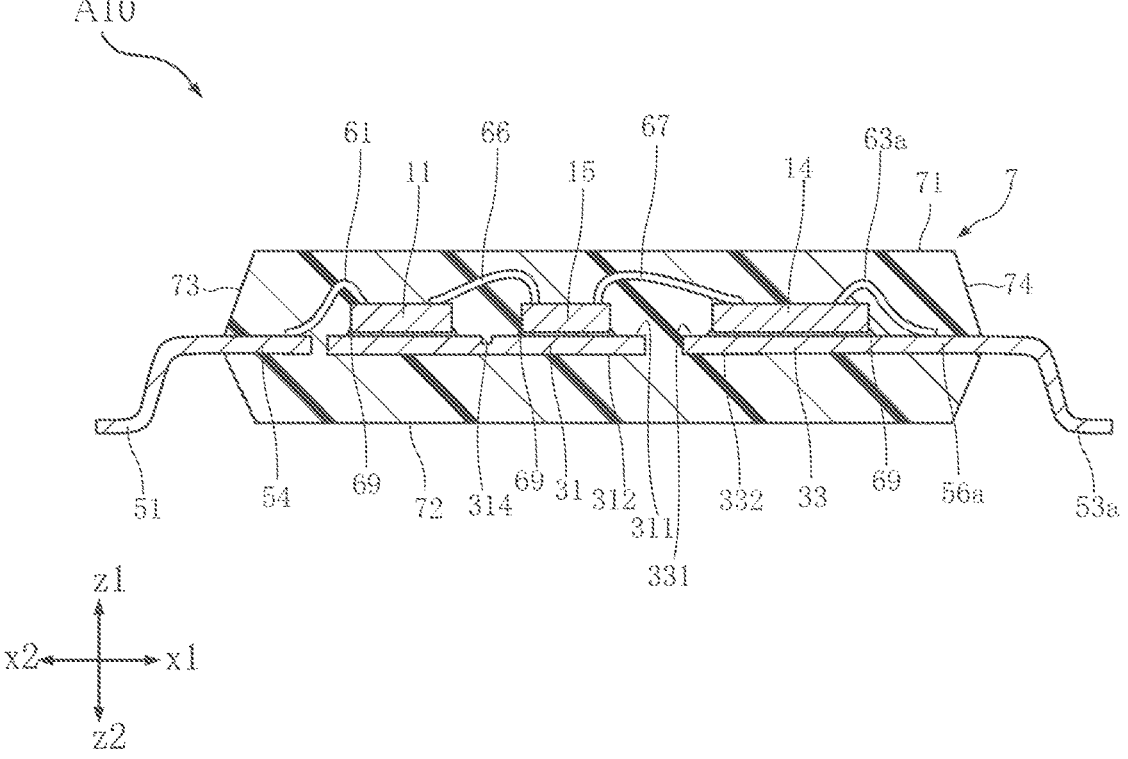
FIG. 8 is a sectional view taken along line VIII-VIII of FIG. 2.
Figure 9:
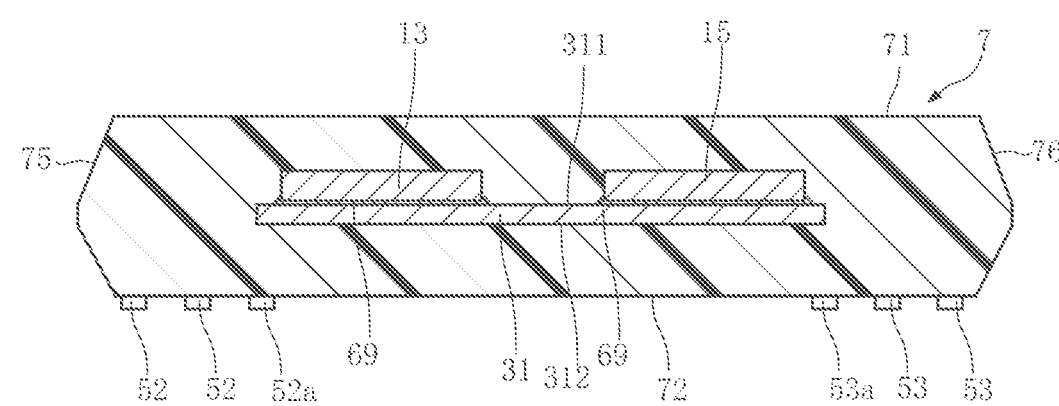
FIG. 9 is a sectional view taken along line IX-IX of FIG. 2.
Figure 9:
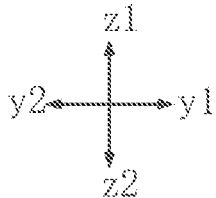
Figure 10:
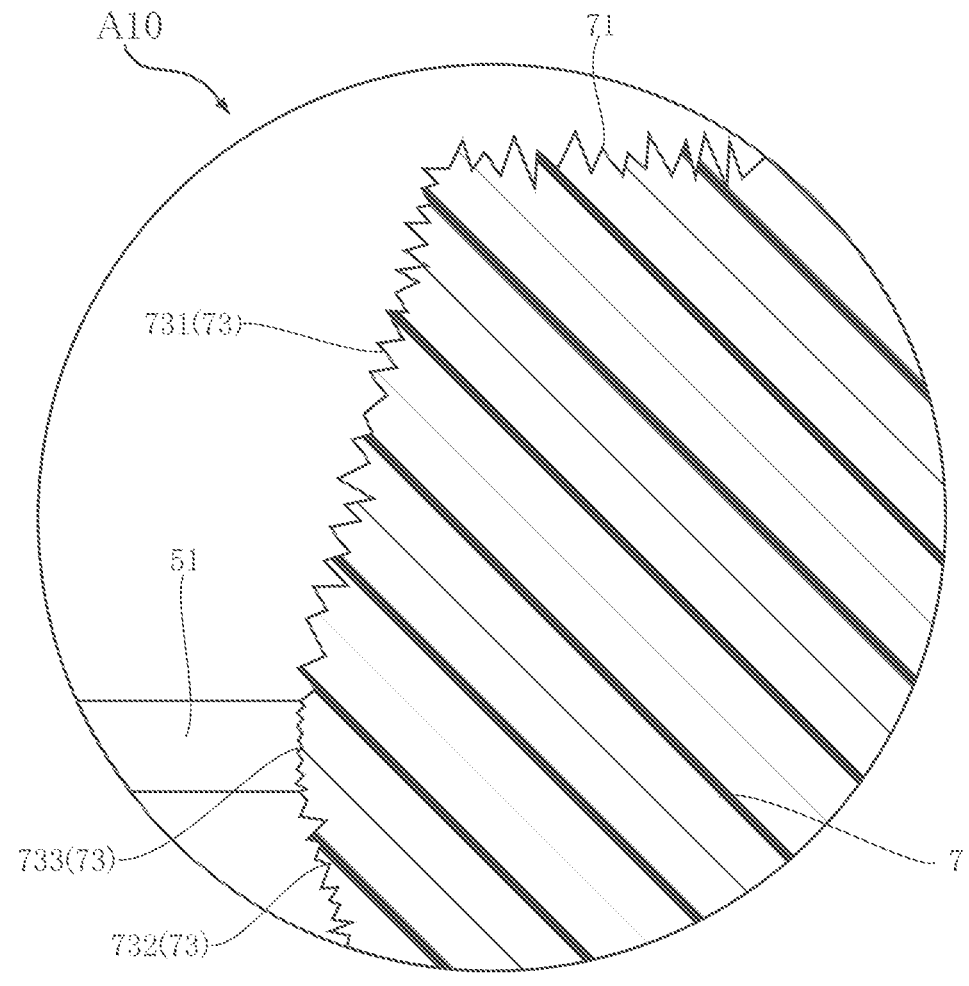
FIG. 10 is a sectional view taken along line X-X of FIG. 1.
Figure 10:
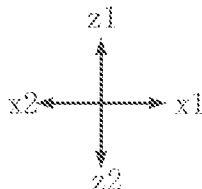
Figure 11:
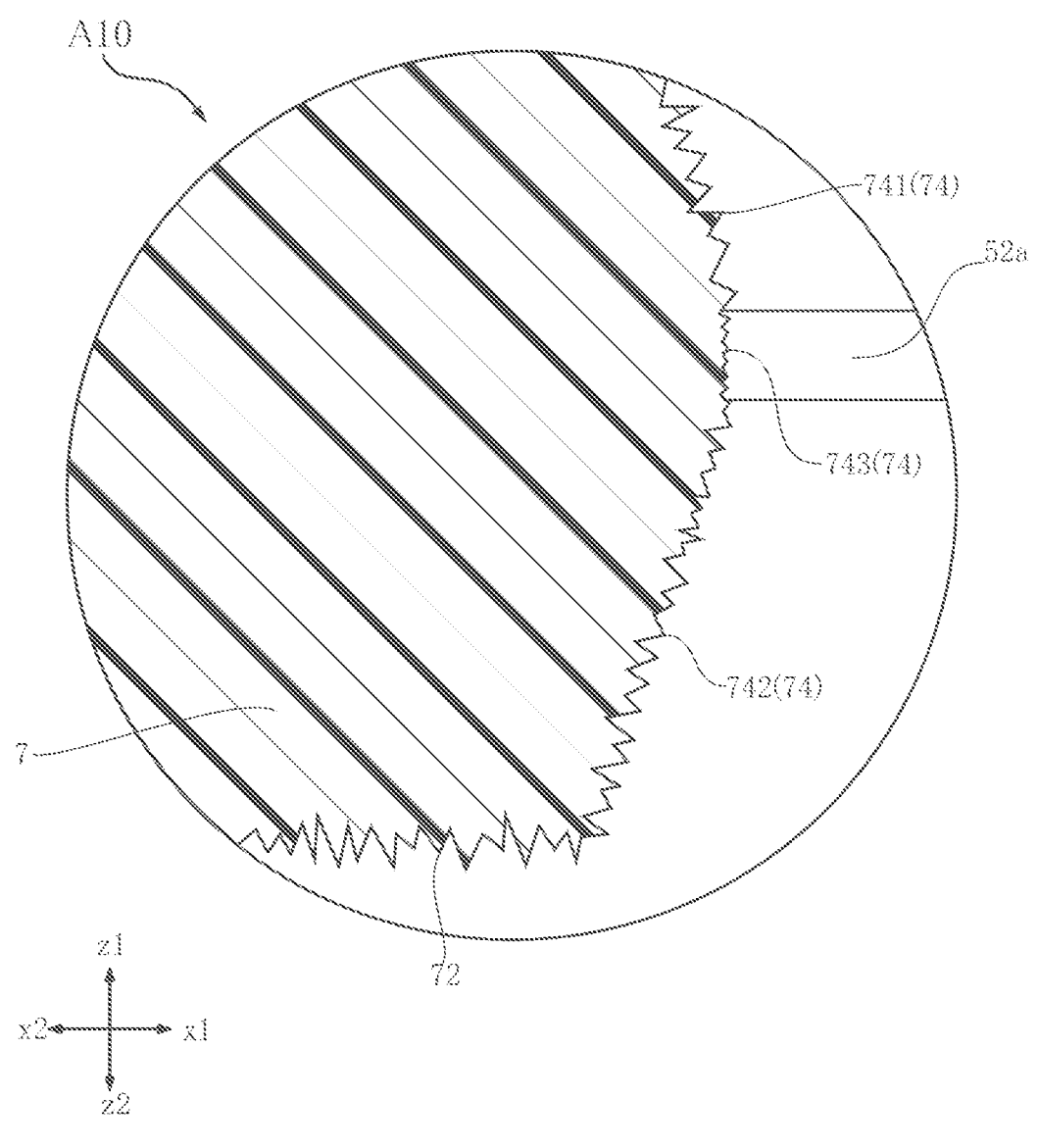
FIG. 11 is a sectional view taken along line XI-XI of FIG. 1.

FIG. 1 is a plan view of the semiconductor device A10. FIG. 2 is a plan view of the semiconductor device A10. For convenience, FIG. 2 shows the sealing resin 7 as transparent and shows the outline of the sealing resin 7 in imaginary lines (dash-double dot lines). FIG. 3 is a front view of the semiconductor device A10. FIG. 4 is a rear view of the semiconductor device A10. FIG. 5 is a left-side view of the semiconductor device A10. FIG. 6 is a right-side view of the semiconductor device A10. FIG. 7 is a sectional view taken along line VII-VII of FIG. 2. FIG. 8 is a sectional view taken along line VIII-VIII of FIG. 2. FIG. 9 is a sectional view taken along line IX-IX of FIG. 2. FIG. 10 is a sectional view taken along line X-X of FIG. 1. FIG. 11 is a sectional view taken along line XI-XI of FIG. 1.

The semiconductor device A10 has the shape of an oblong rectangle as viewed in the thickness direction (in plan view). For convenience, the thickness direction of the semiconductor device A10 is designated as the z direction. A direction orthogonal to the z direction and parallel to one side of the semiconductor device A10 (the horizontal direction shown in the FIGS. 1 and 2) is designated as the x direction. The direction orthogonal to the z and x directions (the vertical direction shown in the FIGS. 1 and 2) is designated as the y direction. The x direction is an example of the "first direction" and the y direction is an example of the "second direction", but the present disclosure is not limited thereto.

The semiconductor control element 11, the first drive element 12, the first insulating element 13, the second drive element 14 and the second insulating element 15 are integral to the functionality of the semiconductor device A10.

As shown in FIG. 2, the semiconductor control element 11, which is mounted on a portion of the electroconductive support member 2 (the first die pad 31 as described later), is located at the center of the semiconductor device A10 in the y direction and offset to the x2 side in the x direction. The semiconductor control element 11 has a rectangular shape elongated in the y direction as viewed in the z direction. The semiconductor control element 11 includes a circuit for converting a control signal inputted from, for example, an ECU into a PWM control signal and also includes a transmitting circuit for transmitting a PWM control signal to the first drive element 12 and the second drive element 14. In this embodiment, the semiconductor control element 11 receives a control signal for the high side and a control signal for the low side and transmits a PWM control signal for the high side to the first drive element 12 and a PWM control signal for the low side to the second drive element 14.

As shown in FIG. 2, the first drive element 12, which is mounted on a portion of the electroconductive support member 2 (the second die pad 32 as described later), is offset in the semiconductor device A10 to the x1 side in the x direction and to the y2 side beyond the center in the y direction. The first drive element 12 is located on the x1 side in the x direction with respect to the semiconductor control element 11. The first drive element 12 has a rectangular shape as viewed in the z direction. The first drive element 12 includes a receiving circuit for receiving a PWM control signal transmitted from the semiconductor control element 11 and a circuit for issuing a drive signal (a gate driver) for driving a switching element (e.g., IGBT or MOSFET) based on the received PWM control signal. The first drive element 12 drives a high-side switching element.

As shown in FIG. 2, the second drive element 14, which is mounted on a portion of the electroconductive support member 2 (the third die pad 33 as described later), is offset in the semiconductor device A10 to the x1 side in the x direction and to the y1 side beyond the center in the y direction. The second drive element 14 is located on the x1 side in the x direction with respect to the semiconductor control element 11 and on the y1 side in the y direction with respect to the first drive element 12. The first drive element 12 and the second drive element 14 are at the same position in the x direction and side by side in the y direction. The second drive element 14 has a rectangular shape as viewed in the z direction. The second drive element 14 includes a receiving circuit for receiving a PWM control signal transmitted from the semiconductor control element 11 and a circuit for issuing a drive signal (a gate driver) for driving a switching element based on the received PWM control signal. The second drive element 14 drives a low-side switching element.

In this embodiment, the first drive element 12 drives a high-side switching element based on a high-side PWM control signal, and the second drive element 14 drives a low-side switching element based on a low-side PWM control signal. The high-side and the low-side, however, may be interchangeable. In other words, the first drive element 12 may be used to drive a low-side switching element based on a low-side PWM control signal, and the second drive element 14 may be used to drive a high-side switching element based on a high-side PWM control signal.

As shown in FIG. 2, the first insulating element 13, which is mounted on a portion of the electroconductive support member 2 (the first die pad 31), is located offset in the semiconductor device A10 to the y2 side beyond the center in the y direction. The first insulating element 13 is located on the x2 side in the x direction with respect to the first drive element 12 and on the x1 side in the x direction with respect to the semiconductor control element 11. That is, the first insulating element 13 is located between the first drive element 12 and the semiconductor control element 11 in the x direction. The first insulating element 13 has a rectangular shape elongated in the y direction as viewed in the z direction. The first insulating element 13 is provided for transmitting a PWM control signal in an insulated condition. The first insulating element 13 receives a PWM control signal from the semiconductor control element 11 via the wires 64 and transmits the received PWM control signal to the first drive element 12 via the wires 65 in an insulated condition. That is, the first insulating element 13 provides a signal transmission between the first drive element 12 and the semiconductor control element 11, while also providing electrical insulation between the first drive element 12 and the semiconductor control element 11.

In this embodiment, the first insulating element 13 is of an inductive-coupling type. An inductive-coupling type insulating element implements insulated transmission of signals by inductively coupling two inductors (coils). The first insulating element 13 includes a substrate made of Si and the inductors made of Cu on the substrate. The inductors include a transmitting-side inductor and a receiving-side inductor stacked with each other in the thickness direction (the z direction) of the first insulating element 13. Between the transmitting-side inductor and the receiving-side inductor, a dielectric layer made of e.g., SiO2 is interposed. The dielectric layer electrically insulates the transmitting-side inductor and the receiving-side inductor. Although the first insulating element 13 of this embodiment is of an inductive type, the first insulating element 13 may be of a capacitive type. A capacitor is an example of a capacitive type insulating element.

As shown in FIG. 2, the second insulating element 15, which is mounted on a portion of the electroconductive support member 2 (the first die pad 31), is located offset in the semiconductor device A10 to the y1 side beyond the center in the y direction. The first insulating element 13 and the second insulating element 15 are located at the same position in the x direction and side by side in the y direction. The second insulating element 15 is located on the x2 side in the x direction with respect to the second drive element 14 and on the x1 side in the x direction with respect to the semiconductor control element 11. That is, the second insulating element 15 is located between the second drive element 14 and the semiconductor control element 11 in the x direction. The second insulating element 15 has a rectangular shape elongated in the y direction as viewed in the z direction. The second insulating element 15 is provided for transmitting a PWM control signal in an insulated condition. The second insulating element 15 receives a PWM control signal from the semiconductor control element 11 via the wires 66 and transmits the received PWM control signal to the second drive element 14 via the wires 67 in an insulated condition. That is, the second insulating element 15 provides a signal transmission between the second drive element 14 and the semiconductor control element 11, while also providing electrical insulation between the second drive element 14 and the semiconductor control element 11. In this embodiment, the second insulating element 15 is of an inductive-coupling type as with the first insulating element 13. Alternatively, the second insulating element 15 may be of a capacitive type.

The semiconductor control element 11 transmits a high-side PWM control signal to the first drive element 12 via the first insulating element 13 and a low-side PWM control signal to the second drive element 14 via the second insulating element 15. Signals other than the PWM control signals may also be transmitted from the semiconductor control element 11 to the first drive element 12 via the first insulating element 13 and to the second drive element 14 via the second insulating element 15. Signals may also be transmitted from the first drive element 12 to the semiconductor control element 11 via the first insulating element 13. Similarly, signals may also be transmitted from the second drive element 14 to the semiconductor control element 11 via the second insulating element 15. Note that the signals transmitted from the first drive element 12 and the second drive element 14 to the semiconductor control element 11 are not specifically limited and may indicate any appropriate information.

Generally, the motor driver circuit used in an inverter device incorporated in, for example, a hybrid vehicle is a half-bridge circuit composed of a low-side switching element and a high-side switching element connected by totem-pole configuration. An insulated gate driver turns on only one of the low-side switching element and the high-side switching element at an any given time. In the high-voltage region, the source of the low-side switching element and the reference voltage of the insulated gate driver for driving the low-side switching element are connected to ground, so that the setting of the gate-to-source voltage is relative to the ground. In contrast, the source of the high-side switching element and the reference voltage of the insulated gate driver for driving the high-side switching element are connected to the output node of the half-bridge circuit. The potential at the output node of the half-bridge circuit changes depending on which of the low-side switching element and the high-side switching element is on, so that the reference potential of the high-side insulated gate driver changes as well. When the high-side switching element is on, the reference potential is equal to the voltage applied to the drain of the high-side switching element (e.g., 600 V or higher). In the semiconductor device A10, the first drive element 12 is used as an insulated gate driver for driving a high-side switching element. The first drive element 12 and the semiconductor control element 11 are connected to different grounds for ensuring insulation, so that the first drive element 12 may be subjected to a transient voltage of 600 V or higher relative to the ground of the semiconductor control element 11. In light of such a large potential difference occurring between the first drive element 12 and the semiconductor control element 11, the semiconductor device A10 includes the first insulating element 13 that electrically isolates the input-side circuit including the semiconductor control element 11 and the first output-side circuit including the first drive element 12 from each other. That is, the first insulating element 13 provides electrical insulation between the input-side circuit held at lower potential and the first output-side circuit held at higher potential. Also, the semiconductor device A10 additionally includes the second insulating element 15 that electrically isolates the input-side circuit including the semiconductor control element 11 and the second output-side circuit including the second drive element 14 from each other. That is, the second insulating element 15 provides electrical insulation between the input-side circuit held at lower potential and the second output-side circuit held at higher potential.

A plurality of non-illustrated electrodes are disposed on the upper surfaces (the surfaces on the z1 side) of the semiconductor control element 11, the first drive element 12, the first insulating element 13, the second drive element 14 and the second insulating element 15.

The electroconductive support member 2 forms conduction paths connecting the semiconductor control element 11, the first drive element 12 and the second drive element 14 of the semiconductor device A10 to the wiring board of an inverter device. The electroconductive support member 2 may be made of an alloy containing Cu, for example. The electroconductive support member 2 is formed from a leadframe 80, which will be described later. The electroconductive support member 2 supports the semiconductor control element 11, the first drive element 12, the first insulating element 13, the second drive element 14 and the second insulating element 15 mounted thereon. As shown in FIG. 2, the electroconductive support member 2 includes the first die pad 31, the second die pad 32, the third die pad 33, the input-side terminals 51, the first output-side terminals 52, the second output-side terminals 53 and the pad portions 54 to 56.

The first die pad 31 is located at the center of the semiconductor device A10 in the y direction and offset to the x2 side in the y direction. The second die pad 32 and the third die pad 33 are located on the x1 side in the x direction with respect to the first die pad 31 and spaced apart from the first die pad 31. The second die pad 32 and the third die pad 33 are spaced apart from each other in the y direction, with the second die pad 32 located on the y2 side in the y direction and the third die pad 33 on the y1 side.

As shown in FIGS. 2 and 7 to 9, the first die pad 31 has the semiconductor control element 11, the first insulating element 13 and the second insulating element 15 mounted thereon. The first die pad 31 is electrically connected to the semiconductor control element 11 and is one element of the input-side circuit described above. The first die pad 31 may be rectangular elongated in the x direction as viewed in the z direction. The first die pad 31 has an obverse surface 311 and a reverse surface 312. The obverse surface 311 and the reverse surface 312 are spaced apart in the z direction as shown in FIGS. 7 to 9. The obverse surface 311 is on the z1 side and the reverse surface 312 is on the z2 side. Each of the obverse surface 311 and the reverse surface 312 is flat (or substantially flat). As shown in FIGS. 7 to 9, the semiconductor control element 11, the first insulating element 13 and the second insulating element 15 are each bonded to the obverse surface 311 of the first die pad 31 by a bonding layer 69. The bonding layer 69 is made by solidifying a paste of metal, such as Ag. The bonding layer 69 is not limited to this example and may be made from a paste of solder or sintered metal or even from an insulating paste.

In this embodiment, the first die pad 31 includes a plurality of grooves 314.

As shown in FIGS. 2, 7 and 8, the grooves 314 are recessed from the obverse surface 311 in the z direction and extends in the y direction. In this embodiment, three grooves 314 are aligned in the y direction at a location between the semiconductor control element 11 and the first and second insulating elements 13 and 15 in the x direction. In this embodiment, the grooves 314 are formed by half-etching. The method of forming the grooves 314 is not limited to half-etching. For example, the grooves 314 may be formed by a stamping process of depressing appropriate portions of the obverse surface 311. The grooves 314 are provided to improve the adhesion of the sealing resin 7 to the first die pad 31. The shapes, locations and number of the grooves 314 to be provided are not specifically limited. In one example, the grooves 314 may penetrate the first die pad 31 in the z direction. In another example, the first die pad 31 may be without the grooves 314.

As shown in FIGS. 2 and 7, the second die pad 32 has the first drive element 12 mounted thereon. The second die pad 32 is electrically connected to the first drive element 12 and is one element of the first output-side circuit described above. The second die pad 32 may be rectangular as viewed in the z direction. The second die pad 32 has an obverse surface 321 and a reverse surface 322. The obverse surface 321 and the reverse surface 322 are spaced apart in the z direction as shown in FIG. 7. The obverse surface 321 is on the z1 side and the reverse surface 322 is on the z2 side. Each of the obverse surface 321 and the reverse surface 322 is flat (or substantially flat). As shown in FIG. 7, the first drive element 12 is bonded to the obverse surface 321 of the second die pad 32 by a bonding layer 69.

In this embodiment, the second die pad 32 includes a protrusion 323. As shown in FIG. 2, the protrusion 323 protrudes outward from the side surface of the second die pad 32 on the x1 side in the x direction. On the side surface, the protrusion 323 is offset to the y1 side in the y direction. The protrusion 323 is not exposed from the sealing resin 7. The protrusion 323 is a portion where the second die pad 32 is clamped and held firmly during the wire bonding in a manufacturing process.

As shown in FIGS. 2 and 8, the third die pad 33 has the second drive element 14 mounted thereon. The third die pad 33 is electrically connected to the second drive element 14 and is one element of the second output-side circuit described above. The third die pad 33 may be rectangular as viewed in the z direction. The third die pad 33 has an obverse surface 331 and a reverse surface 332. The obverse surface 331 and the reverse surface 332 are spaced apart in the z direction as shown in FIG. 8. The obverse surface 331 is on the z1 side and the reverse surface 332 is on the z2 side. Each of the obverse surface 331 and the reverse surface 332 is flat (or substantially flat). As shown in FIG. 8, the second drive element 14 is bonded to the obverse surface 331 of the third die pad 33 by a bonding layer 69.

In this embodiment, the third die pad 33 includes a protrusion 333. As shown in FIG. 2, the protrusion 333 protrudes outward from the side surface of the third die pad 33 on the x1 side in the x direction. On the side surface, the protrusion 333 is offset to the y2 side in the y direction. The protrusion 333 is not exposed from the sealing resin 7. The protrusion 333 is a portion where the third die pad 33 is clamped and held firmly during the wire bonding in a manufacturing process.

The input-side terminals 51 form conduction paths connecting the semiconductor device A10 to the wiring board of an inverter device when bonded to the wiring board. The input-side terminals 51, which are electrically connected to the semiconductor control element 11 as necessary, are components of the input-side circuit described above. As shown in FIGS. 1, 2 and 5, the input-side terminals 51 are spaced apart from each other in the y direction at equal intervals. The input-side terminals 51 are located on the x2 side in the x direction with respect to the first die pad 31 and protrude from the sealing resin 7 (the side surface 73 as described later) to the x2 side in the x direction. The input-side terminals 51 include a power supply terminal for receiving supply voltage, a ground terminal, and an input terminal for receiving a control signal. In this embodiment, the semiconductor device A10 includes, but not limited to, 14 input-side terminals 51. The input-side terminals 51 are also not limited as to the signals inputted to and outputted therefrom.

Each input-side terminal 51 has a rectangular shape elongated in the x direction and includes a portion exposed from the sealing resin 7 and a portion covered with the sealing resin 7. As shown in FIGS. 7 to 8, each input-side terminal 51 has a gull-wing profile formed by bending the portion exposed from the sealing resin 7. Each input-side terminal 51 may be provided with a plating layer covering the portion exposed from the sealing resin 7. The plating layer may be made of an Sn-containing alloy, such as solder, and covers the portion exposed from the sealing resin 7. The plating layer improves the adhesion of solder to the exposed portion when the semiconductor device A10 is soldered to the wiring board of an inverter device and prevents erosion of the exposed portion which may be caused by the solder. Each input-side terminal 51 includes a portion protruding in the y direction within the portion covered with the sealing resin 7. The plurality of input-side terminals 51 include input-side terminals 51a and 51b. The input-side terminal 51a is located farthest on the y2 side in the y direction among the input-side terminals 51. The input-side terminal 51b is located farthest on the y1 side in the y direction among the input-side terminals 51. That is, the input-side terminals 51a and 51b are a pair of input-side terminals that are most distant from each other in the y direction among the input-side terminals 51.

Each pad portion 54 is connected to the end of an input-side terminal 51 on the x1 side in the x direction. Although not limited to a specific shape, the pad portions 54 in this embodiment are rectangular as viewed in the z direction. Each pad portion 54 has a flat (or substantially flat) upper surface (the surface on the z1 side), and a wire 61 is bonded thereto. The upper surface of each pad portion 54 may be provided with a plating layer. The plating layer may be made of metal containing Ag, for example, and covers the upper surface of the pad portion 54. The plating layer serves to increase the strength of bonding to the wire 61 and to protect the leadframe 80 from impact or shock expected at the time of bonding the wire 61. Note that one or more of the pad portions 54 may be without a wire 61 bonded thereto. The pad portions 54 are entirely covered with the sealing resin 7. The plurality of pad portions 54 include pad portions 54a and 54b. The pad portion 54a is connected to the input-side terminal 51a. The pad portion 54a extends in the y direction and has the end on the y1 side in the y direction connected to the first die pad 31. That is, the input-side terminal 51a is connected to the first die pad 31 via the pad portion 54a and thus supports the first die pad 31. The pad portion 54b is connected to the input-side terminal 51b. The pad portion 54b extends in the y direction and has the end on the y2 side in the y direction connected to the first die pad 31. That is, the input-side terminal 51b is connected to the first die pad 31 via the pad portion 54b and thus supports the first die pad 31.

Similarly to the input-side terminals 51, the first output-side terminals 52 form conduction paths connecting the semiconductor device A10 to the wiring board of an inverter device when bonded to the wiring board. The first output-side terminals 52, which are electrically connected to the first drive element 12 as necessary, are components of the first output-side circuit described above. As shown in FIGS. 1, 2 and 6, the first output-side terminals 52 are spaced apart from each other in the y direction at equal intervals. The first output-side terminals 52 are located on the x1 side in the x direction with respect to the second die pad 32 and protrude from the sealing resin 7 (the side surface 74 as described later) to the x1 side in the x direction. The first output-side terminals 52 include a power supply terminal for receiving supply voltage, a ground terminal, and an output terminal for outputting a drive signal. In this embodiment, the semiconductor device A10 includes, but not limited to, three first output-side terminals 52. The first output-side terminals 52 are also not limited as to the signals inputted to and outputted therefrom.

Each first output-side terminal 52 has a rectangular shape elongated in the x direction and includes a portion exposed from the sealing resin 7 and a portion covered with the sealing resin 7. As shown in FIG. 7, each first output-side terminal 52 has a gull-wing profile formed by bending the portion exposed from the sealing resin 7. As with the input-side terminals 51, each first output-side terminal 52 may be provided with a plating layer (of an Sn-containing alloy, such as solder) covering the portion exposed from the sealing resin 7. Each first output-side terminal 52 includes a portion protruding in the y direction within the portion covered with the sealing resin 7. The plurality of first output-side terminals 52 include a first output-side terminal 52a. The first output-side terminal 52a is located farthest on the y1 side in the y direction among the first output-side terminals 52. That is, the first output-side terminal 52a is closest to the second output-side terminals 53.

The pad portion 55 is connected to the end of a first output-side terminal 52 on the x2 side in the x direction. Although not limited to a specific shape, the pad portions 55 in this embodiment are rectangular as viewed in the z direction. Each pad portion 55 has a flat (or substantially flat) upper surface (the surface on the z1 side), and a wire 62 is bonded thereto. As with the upper surfaces of the pad portions 54, the upper surface of each pad portion 55 may be provided with a plating layer (of metal containing Ag, for example). Note that one or more of the pad portions 55 may be without a wire 62 bonded to. The pad portions 55 are entirely covered with the sealing resin 7. The plurality of pad portions 55 include a pad portion 55a. The pad portion is connected to the first output-side terminal 52a. The pad portion 55a extends in the x direction and has the end on the x2 side in the x direction connected to the second die pad 32. That is, the first output-side terminal 52a is connected to the second die pad 32 via the pad portion 55a and thus supports the second die pad 32.

Similarly to the input-side terminals 51, the second output-side terminals 53 form conduction paths connecting the semiconductor device A10 to the wiring board of an inverter device when bonded to the wiring board. The second output-side terminals 53, which are electrically connected to the second drive element 14 as necessary, are components of the second output-side circuit described above. As shown in FIGS. 1, 2 and 6, the second output-side terminals 53 are located on the y2 side in the y direction with respect to the first output-side terminals 52 and spaced apart from each other in the y direction at equal intervals. The second output-side terminals 53 are located on the x1 side in the x direction with respect to the third die pad 33 and protrude from the sealing resin 7 (the side surface 74 as described later) to the x1 side in the x direction. The second output-side terminals 53 include a power supply terminal for receiving supply voltage, a ground terminal, and an output terminal for outputting a drive signal. In this embodiment, the semiconductor device A10 includes, but not limited to, three second output-side terminals 53. The second output-side terminals 53 are also not limited as to the signals inputted to and outputted therefrom.

Each second output-side terminal 53 has a rectangular shape elongated in the x direction and includes a portion exposed from the sealing resin 7 and a portion covered with the sealing resin 7. As shown in FIG. 8, each second output-side terminal 53 has a gull-wing profile formed by bending the portion exposed from the sealing resin 7. As with the input-side terminals 51, each second output-side terminal 53 may be provided with a plating layer (of an Sn-containing alloy, such as solder) covering the portion exposed from the sealing resin 7. Each second output-side terminal 53 includes a portion protruding in the y direction within the portion covered with the sealing resin 7. The plurality of second output-side terminals 53 include a second output-side terminal 53a. The second output-side terminal 53a is located farthest on the y2 side in the y direction among the second output-side terminals 53. That is, the second output-side terminal 53a is closest to the first output-side terminals 52.

The pad portions 56 are connected to the end of the second output-side terminals 53 on the x2 side in the x direction. Although not limited to a specific shape, the pad portions 56 in this embodiment are rectangular as viewed in the z direction but not limited to such shape. Each pad portion 56 has a flat (or substantially flat) upper surface (the surface on the z1 side), and a wire 63 is bonded thereto. As with the upper surfaces of the pad portions 54, the upper surface of each pad portion 56 may be provided with a plating layer (of metal containing Ag, for example). Note that one or more of the pad portions 56 may be without a wire 63 bonded thereto. The pad portions 56 are entirely covered with the sealing resin 7. The plurality of pad portions 56 include a pad portion 56a. The pad portion 56a is connected to the second output-side terminal 53a. The pad portion 56a extends in the x direction and has the end on the x2 side in the x direction connected to the third die pad 33.

That is, the second output-side terminal 53*a* is connected to the third die pad 33 via the pad portion 56*a* and thus supports the third die pad 33.

In the semiconductor device A10, the first drive element 12 may receive a transient voltage of 600 V or higher relative to the ground of the semiconductor control element 11. As a result, a significant potential difference may occur between the first output-side terminals 52 electrically connected to the first drive element 12 and the input-side terminals 51 electrically connected to the semiconductor control element 11. In addition, as the potential difference between the second drive element 14 and the semiconductor control element 11 is relatively small, a significant potential difference may also occur between the first output-side terminals 52 electrically connected to the first drive element 12 and the second output-side terminals 53 electrically connected to the second drive element 14.

In this embodiment, as shown in FIG. 1, a large separation distance is provided in the y direction between the portions of the first output-side terminals 52 exposed from the sealing resin 7 and the portions of the second output-side terminals 53 exposed from the sealing resin 7. Specifically, let a first inter-terminal distance L1 denote the separation distance between the exposed portion of the first output-side terminal 52*a* and the exposed portion of the second output-side terminal 53*a*, and a second inter-terminal distance L2 denote the separation distance between the exposed portions of a pair of two adjacent first output-side terminals 52. Then, the first inter-terminal distance L1 is about 13 times greater than the second inter-terminal distance L2. Although not specifically limited, the first inter-terminal distance L1 is preferably at least three times greater, and more preferably at least nine times greater than the second inter-terminal distance L2.

As shown in FIG. 2, the wires 61 to 67 together with the electroconductive support member 2 form conduction paths for the semiconductor control element 11, the first drive element 12 and the second drive element 14 to perform their functions. The wires 61 to 64 may be made of metal, such as Au, Cu or Al.

As shown in FIGS. 2, 7 and 8, the wires 61 form conduction paths connecting the semiconductor control element 11 and the input-side terminals 51. The wires 61 electrically connect the semiconductor control element 11 to at least one of the input-side terminals 51. The wires 61 are components of the input-side circuit described above. Each wire 61 is bonded to an electrode of the semiconductor control element 11. The plurality of wires 61 include wires 61*a* and 61*b*. The wire 61*a* extends from the semiconductor control element 11 to the y2 side in the y direction and is bonded to the pad portion 54*a* connected to the input-side terminal 51*a*. In this way, the semiconductor control element 11 is electrically connected via the wire 61*a* and the pad portion 54*a* to the input-side terminal 51*a*. The wire 61*a* does not overlap with the first insulating element 13 as viewed in the z direction. Note that the wire 61*a* may be bonded to the first die pad 31. The wire 61*b* extends from semiconductor control element 11 to the y1 side in the y direction and is bonded to the pad portion 54*b* connected to the input-side terminal 51*b*. In this way, the semiconductor control element 11 is electrically connected via the wire 61*b* and the pad portion 54*b* to the input-side terminal 51*b*. The wire 61*b* does not overlap with the second insulating element 15 as viewed in the z direction. Note that the wire 61*a* may be bonded to the first die pad 31. The numbers of the wires 61*a* and 61*b* to be provided are not specifically limited. Each wire 61 other than the wires 61*a* and 61*b* extends from the semiconductor control element 11 to the x2 side or in the y direction and is bonded to a pad portion 54. The number of the wires 61 to be bonded to each pad portion 54 is not specifically limited.

As shown in FIGS. 2 and 7, the wires 62 form conduction paths connecting the first drive element 12 and the first output-side terminals 52. The wires 62 electrically connect the first drive element 12 to at least one of the first output-side terminals 52. The wires 62 are components of the first output-side circuit described above. Each wire 62 is bonded to an electrode of the first drive element 12. The plurality of wires 62 include a wire 62*a*. The wire 62*a* extends from the first drive element 12 to the x1 side in the x direction and is bonded to the pad portion 55*a* connected to the first output-side terminal 52*a*. In this way, the first drive element 12 is electrically connected via the wire 62*a* and the pad portion 55*a* to the first output-side terminal 52*a*. Note that the wire 62*a* may be bonded to the second die pad 32. The number of the wires 62*a* to be provided is not specifically limited. Each wire 62 other than the wire 62*a* extends from the first drive element 12 to the y2 side in the y direction and is bonded to a pad portion 55. The number of the wires 62 to be bonded to each pad portion 55 is not specifically limited.

As shown in FIGS. 2 and 8, the wires 63 form conduction paths connecting the second drive element 14 and the second output-side terminals 53. The wires 63 electrically connect the second drive element 14 to at least one of the second output-side terminals 53. The wires 63 are components of the second output-side circuit described above. Each wire 63 is bonded to an electrode of the second drive element 14. The plurality of wires 63 include a wire 63*a*. The wire 63*a* extends from the second drive element 14 to the x1 side in the x direction and is bonded to the pad portion 56*a* connected to the second output-side terminal 53*a*. In this way, the second drive element 14 is electrically connected via the wire 63*a* and the pad portion 56*a* to the second output-side terminal 53*a*. Note that the wire 63*a* may be bonded to the third die pad 33. The number of the wires 63*a* to be provided is not specifically limited. Each wire 63 other than the wire 63*a* extends from the second drive element 14 to the y1 side in the y direction and is bonded to a pad portion 56. The number of the wires 63 to be bonded to each pad portion 56 is not specifically limited.

As shown in FIGS. 2 and 7, the wires 64 form conduction paths connecting the semiconductor control element 11 and the first insulating element 13. The wires 64 electrically connect the semiconductor control element 11 and the first insulating element 13 to each other. The wires 64 are components of the input-side circuit described above. Each wire 64 extends in the x direction (or substantially in the x direction) and is bonded to an electrode of the semiconductor control element 11 and an electrode of the first insulating element 13. The number of the wires 64 to be provided is not specifically limited.

As shown in FIGS. 2 and 7, the wires 65 form conduction paths connecting the first drive element 12 and the first insulating element 13. The wires 65 electrically connect the first drive element 12 and the first insulating element 13 to each other. The wires 65 are components of the first output-side circuit described above. Each wire 65 extends in the x direction (or substantially in the x direction) and is bonded to an electrode of the first drive element 12 and an electrode of the first insulating element 13. The number of the wires to be provided is not specifically limited.

As shown in FIGS. 2 and 8, the wires 66 form conduction paths connecting the semiconductor control element 11 and the second insulating element 15. The wires 66 electrically connect the semiconductor control element 11 and the second insulating element 15 to each other. The wires 66 are components of the input-side circuit described above. Each wire 66 extends in the x direction (or substantially in the x direction) and is bonded to an electrode of the semiconductor control element 11 and an electrode of the second insulating element 15. The number of the wires 66 to be provided is not specifically limited.

As shown in FIGS. 2 and 8, the wires 67 form conduction paths connecting the second drive element 14 and the second insulating element 15. The wires 67 electrically connect the second drive element 14 and the second insulating element 15 to each other. The wires 67 are components of the second output-side circuit described above. Each wire 67 extends in the x direction (or substantially in the x direction) and is bonded to an electrode of the second drive element 14 and an electrode of the second insulating element 15. The number of the wires 67 to be provided is not specifically limited.

As shown in FIG. 1, the sealing resin 7 covers the semiconductor control element 11, the first drive element 12, the first insulating element 13, the second drive element 14, the second insulating element 15, the first die pad 31, the second die pad 32, the third die pad 33, the pad portions 54 to 56, the wires 61 to 67, a portion of each input-side terminal 51, a portion of each first output-side terminal 52, and a portion of each second output-side terminal 53. The sealing resin 7 is electrically insulating. The sealing resin 7 is made of a material containing black epoxy resin, for example. The sealing resin 7 is rectangular as viewed in the z direction. In this embodiment, the sealing resin 7 may have an x-direction dimension of about 7 to 9 μm, a y-direction dimension of about 8 to 12 μm and a z-direction dimension of about 1.7 to 2.7 μm, but the respective dimensions are not limited to these.

As shown in FIGS. 3 to 6, the sealing resin 7 includes a top surface 71, a bottom surface 72 and side surfaces 73 to 76.

The top surface 71 and the bottom surface 72 are spaced apart from each other in the z direction. The top surface 71 and the bottom surface 72 face away from each other in the z direction. The top surface 71 is on the z1 side in the z direction, facing the z1 side as with the obverse surface 311 of the first die pad 31. The bottom surface 72 is located on the z2 side in the z direction, facing the z2 side as with the reverse surface 312 of the first die pad 31. Each of the top surface 71 and the bottom surface 72 is flat (or substantially flat).

Each of the side surfaces 73 to 76 is connected to the top surface 71 and the bottom surface 72 and located between the top surface 71 and the bottom surface 72 in the z direction. The side surfaces 73 and 74 are spaced apart from each other in the y direction. The side surfaces 73 and 74 face away from each other in the x direction. The side surface 73 is located on the x2 side in the x direction, and the side surface 74 is located on the x1 side in the x direction. The side surfaces 75 and 76 are spaced apart from each other in the y direction and connected to the side surfaces 73 and 74. The side surfaces 75 and 76 face away from each other in the y direction. The side surface 75 is located on the y2 side in the y direction, and the side surface 76 is located on the y1 side in the y direction. As shown in FIG. 1, the portions of the input-side terminals 51 protrude from the side surface 73. In addition, the portions of the first output-side terminals 52 and of the second output-side terminals 53 protrude from the side surface 74. Yet, in the region of the side surface 74 between the first output-side terminal 52a and the second output-side terminal 53a, no portion of the electroconductive support member 2 is exposed. In addition, no portion of the electroconductive support member 2 is exposed on the side surfaces 75 and 76 either. The side surface 74 is an example of the "first side surface", and the side surface 75 is an example of the "second side surface".

As shown in FIG. 5, the side surface 73 includes an upper region 731, a lower region 732 and a middle region 733. The upper region 731 is connected to the top surface 71 at one end in the z direction and to the middle region 733 at the other end in the z direction. The upper region 731 is inclined relative to the top surface 71. The lower region 732 is connected to the bottom surface 72 at one end in the z direction and to the middle region 733 at the other end in the z direction. The lower region 732 is inclined relative to the bottom surface 72. The middle region 733 is connected to the upper region 731 at one end in the z direction and to the lower region 732 at the other end in the z direction. The middle region 733 is parallel to both the z direction and the y direction. As viewed in the z direction, the middle region 733 is located outside the top surface 71 and the bottom surface 72. The middle region 733 is where the portions of the input-side terminals 51 are exposed.

As shown in FIG. 6, the side surface 74 includes an upper region 741, a lower region 742 and a middle region 743. The upper region 741 is connected to the top surface 71 at one end in the z direction and to the middle region 743 at the other end in the z direction. The upper region 741 is inclined relative to the top surface 71. The lower region 742 is connected to the bottom surface 72 at one end in the z direction and to the middle region 743 at the other end in the z direction. The lower region 742 is inclined relative to the bottom surface 72. The middle region 743 is connected to the upper region 741 at one end in the z direction and to the lower region 742 at the other end in the z direction. The middle region 743 is parallel to both the z direction and the y direction. As viewed in the z direction, the middle region 743 is located outside the top surface 71 and the bottom surface 72. The middle region 743 is where the portions of the first output-side terminals 52 and of the second output-side terminals 53 are exposed.

As shown in FIG. 4, the side surface 75 includes an upper region 751, a lower region 752 and a middle region 753. The upper region 751 is connected to the top surface 71 at one end in the z direction and to the middle region 753 at the other end in the z direction. The upper region 751 is inclined relative to the top surface 71. The lower region 752 is connected to the bottom surface 72 at one end in the z direction and to the middle region 753 at the other end in the z direction. The lower region 752 is inclined relative to the bottom surface 72. The middle region 753 is connected to the upper region 751 at one end in the z direction and to the lower region 752 at the other end in the z direction. The middle region 753 is parallel to both the z direction and the y direction. As viewed in the z direction, the middle region 753 is located outside the top surface 71 and the bottom surface 72.

As shown in FIG. 3, the side surface 76 includes an upper region 761, a lower region 762 and a middle region 763. The upper region 761 is connected to the top surface 71 at one end in the z direction and to the middle region 763 at the other end in the z direction. The upper region 761 is inclined relative to the top surface 71. The lower region 762 is connected to the bottom surface 72 at one end in the z direction and to the middle region 763 at the other end in the z direction. The lower region 762 is inclined relative to the bottom surface 72. The middle region 763 is connected to the upper region 761 at one end in the z direction and to the lower region 762 at the other end in the z direction. The middle region 763 is parallel to both the z direction and the y direction. As viewed in the z direction, the middle region 763 is located outside the top surface 71 and the bottom surface 72.

In this embodiment, as shown in FIGS. 10 and 11, the sealing resin 7 has a greater surface roughness on the top surface 71, the bottom surface 72, and each of the upper region 731 and the lower region 732 of the side surface 73 than on the middle region 733 of the side surface 73. Also, the sealing resin 7 has a greater surface roughness on the top surface 71, the bottom surface 72, and each of the upper region 741 and the lower region 742 of the side surface 74 than on the middle region 743 of the side surface 74. The surface roughness of each of the top surface 71 and the bottom surface 72 is preferably between 5 and 20 μm Rz.

Figure 12:
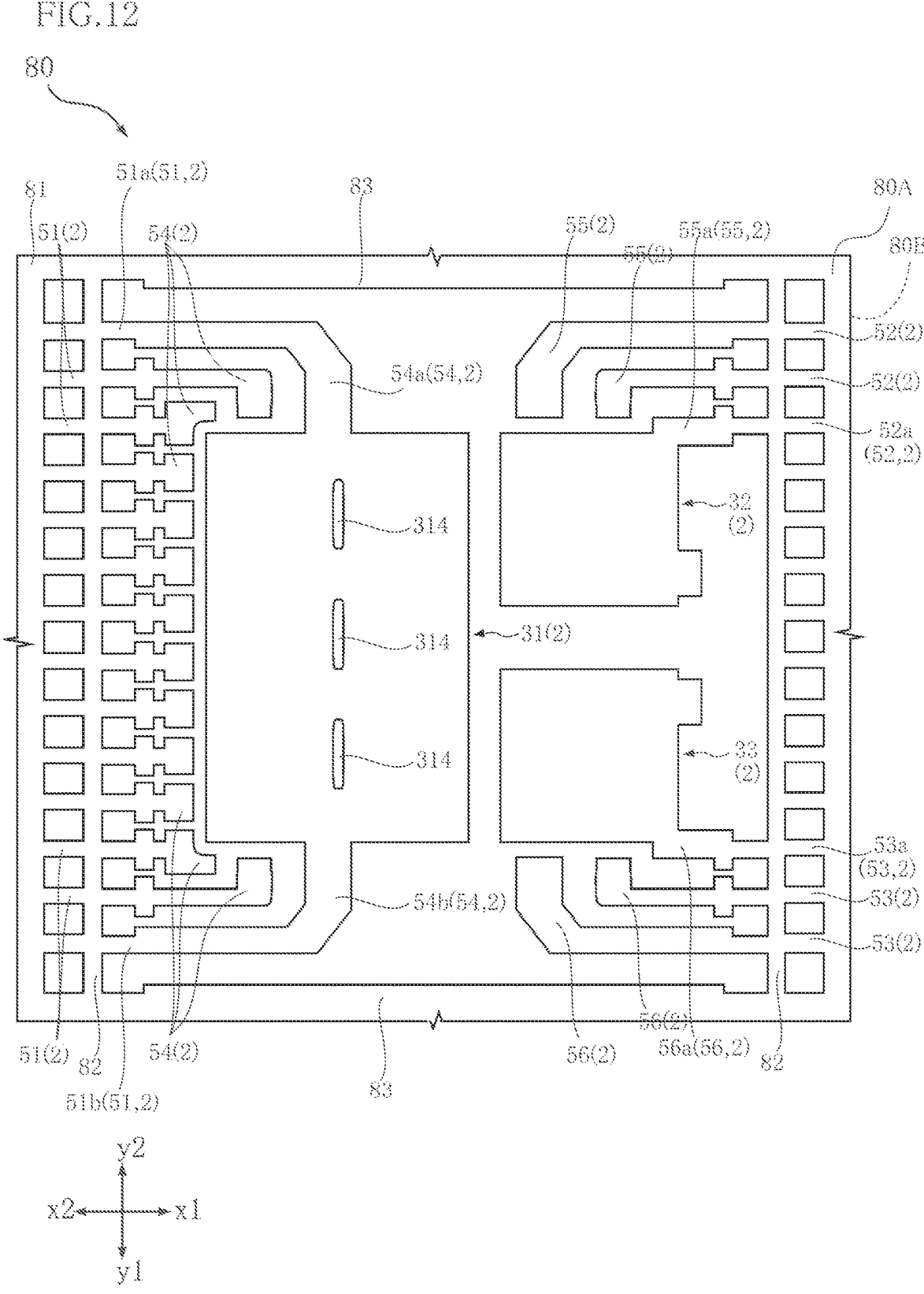
FIG. 12 is a plan view illustrating a process of manufacturing the semiconductor device of FIG. 1.
Figure 13:
FIG. 13 is a plan view illustrating a process of manufacturing the semiconductor device of FIG. 1.
Figure 13:
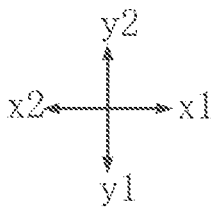

Next, a method of manufacturing the semiconductor device A10 is described with reference to FIGS. 12 and 13. FIGS. 12 and 13 are plan views illustrating processes of manufacturing the semiconductor device A10. The x, y and z directions shown in the figures correspond to those shown in FIGS. 1 to 11.

First, a leadframe 80 is prepared as shown in FIG. 12. The leadframe 80 is a material like a plate. In this embodiment, the leadframe 80 is mainly made of Cu. The leadframe 80 may be formed from a metal plate by etching and other processing. The leadframe 80 is a flat frame without depressions. The leadframe 80 has an obverse surface 80A and a reverse surface 80B spaced apart from each other in the z direction. The grooves 314 are formed by half-etching the obverse surface 80A. The leadframe 80 may be formed from a metal plate by punching. In this case, the grooves 314 are formed by stamping on the obverse surface 80A.

The leadframe 80 includes the electroconductive support member 2 (the first die pad 31, the second die pad 32, the third die pad 33, the input-side terminals 51, the first output-side terminals 52, the second output-side terminals 53 and the pad portions 54 to 56) and additionally includes a frame 81, a plurality of tie bars 82 and a pair of dam bars 83. The frame 81, the tie bars 82 and the dam bars 83 do not form parts of the semiconductor device A10.

As viewed in the z direction, the frame 81 is a closed rectangular structure. The frame 81 surrounds the electroconductive support member 2, the tie bars 82 and the dam bars 83. The input-side terminals 51 are tied to the frame 81 at their ends on the x2 side in the x direction. The first output-side terminals 52 and the second output-side terminals 53 are tied to the frame 81 at their ends on the x1 side in the x direction.

The tie bars 82 extend in the y direction. Each tie bar 82 is tied to the frame 81 at their opposite ends in the y direction. The plurality of tie bars 82 include one located on the x1 side in the x direction and one located on the x2 side in the x direction. The input-side terminals 51 are tied to the tie bar 82 located on the x2 side in the x direction. The first output-side terminals 52 and the second output-side terminals 53 are tied to the tie bar 82 located on the x1 side in the x direction. The pair of dam bars 83 are provided at the opposite ends of the leadframe 80 in the y direction. The pair of dam bars 83 extend in the x direction and protrude toward the electroconductive support member 2.

In the next process, as shown in FIG. 13, the semiconductor control element 11, the first insulating element 13 and the second insulating element 15 are bonded to the first die pad 31 each by a bonding layer 69, the first drive element 12 is bonded to the second die pad 32 by a bonding layer 69, and the second drive element 14 is bonded to the third die pad 33 by a bonding layer 69. For the purpose of illustration, FIG. 13 shows the bonding layers 69 shaded with dots. In the bonding process, a paste of a bonding material, which will be later hardened to form the bonding layers 69, is applied to the regions of the first die pad 31 where the semiconductor control element 11, the first insulating element 13 and the second insulating element 15 will be placed, to the region of the second die pad 32 where the first drive element 12 will be placed, and to the region of the third die pad 33 where the second drive element 14 will be placed. Then, the semiconductor control element 11, the first drive element 12, the first insulating element 13, the second drive element 14 and the second insulating element 15 are placed on the layers of the applied bonding material.

Next, reflowing is performed to melt and then harden the bonding material. Each of the second die pad 32 and the third die pad 33 is supported by a single lead like a cantilever. Despite this structure, the leadframe 80 being a flat frame is less likely to be deformed by the mounting of the first drive element 12 and the second drive element 14.

Next, as shown in FIG. 13, the wires 61 to 67 are formed by wire bonding. The process of forming the wires involves heating the leadframe 80 while the leadframe 80 is held by a mold.

The process of forming the wire 61 begins with lowering a capillary toward the semiconductor control element 11 to press the tip of a wire against an electrode. In this state, by the action of the weight of the capillary, ultrasonic vibrations generated by the capillary, and so on, the wire tip is pressed against the electrode to form a bond. This completes first bonding. Then, the capillary is raised while the wire is continually fed. As a result, a ball bond is formed on the electrode. Subsequently, the capillary is moved to a position directly above a pad portion 54 and then lowered to press the tip of the capillary against the pad portion 54. This causes the wire to be sandwiched between the capillary tip and the pad portion 54 to form a bond. This completes second bonding. Then, the capillary is raised to break the wire.

The process of forming a wire 62 includes the first bonding of a wire to an electrode of the first drive element 12, the process of forming a ball bond on the electrode, and the second bonding of the wire to a pad portion 55. The process of forming a wire 63 includes the first bonding of a wire to an electrode of the second drive element 14, the process of forming a ball bond on the electrode, and second bonding of the wire to a pad portion 56.

The process of forming a wire 64 includes the first bonding of a wire to an electrode of the first insulating element 13, the process of forming a ball bond on the electrode, and the second bonding of the wire to an electrode of the semiconductor control element 11. The process of forming a wire 65 includes the first bonding of a wire to an electrode of the first insulating element 13, the process of forming a ball bond on the electrode, and the second bonding of the wire to an electrode of the first drive element 12. The process of forming a wire 66 includes the first bonding of a wire to an electrode of the second insulating element the process of forming a ball bond on the electrode, and the second bonding of the wire to an electrode of the semiconductor control element 11. The process of forming a wire 67 includes the first bonding of a wire to an electrode of the second insulating element 15, the process of forming a ball bond on the electrode, and the second bonding of the wire to an electrode of the second drive element 14.

Next, a sealing resin 7 is formed. The sealing resin 7 is formed by transfer molding. This process includes placing the leadframe 80 into a mold defining a plurality of cavities. The leadframe 80 is placed, such that the portion of the electroconductive support member 2 to be covered later by the sealing resin 7 of a produced semiconductor device A10 is located within one of the cavities. Then, melted resin is introduced into each cavity. The melted resin is solidified in the cavity to form the sealing resin 7, and resin burrs remaining outside the cavity are removed by, for example, applying high-pressure water jet.

Next, dicing is performed to isolate individual dies, by separating the input-side terminals 51, the first output-side terminals 52 and the second output-side terminals 53 from the frame 81 and the tie bars 82. Through the processes described above, the semiconductor device A10 is manufactured.

The following describes advantages of the semiconductor device A10.

According to this embodiment, the semiconductor device A10 includes the first drive element 12 that generates a drive signal for a high-side switching element and the second drive element 14 that generates a drive signal for a low-side switching element. In other words, one semiconductor device A10 can drive two switching elements of a half-bridge circuit. The semiconductor device A10 including one common semiconductor control element 11 for driving two switching elements is more compact than two conventional semiconductor devices each including a semiconductor control element for driving one switching element. The semiconductor device A10 can therefore reduce the footprint on the wiring board of an inverter device than the footprint necessary for two conventional semiconductor devices. In addition, the semiconductor device A10 does not require spacing that needs to be provided between two conventional semiconductor devices when they are mounted on a wiring board. The footprint of the semiconductor device A10 can be further reduced by the area of the spacing.

According to this embodiment, in addition, the semiconductor device A10 includes the first insulating element 13 that transmits a signal between the first drive element 12 and the semiconductor control element 11, while providing electrical insulation between the first drive element 12 and the semiconductor control element 11. This configuration can improve the voltage insulation between the input-side circuit, which includes the semiconductor control element 11, and the first output-side circuit, which includes the first drive element 12, in light of a significant potential difference possibly occurring between the first drive element 12 and the semiconductor control element 11. According to this embodiment, in addition, the semiconductor device A10 includes the second insulating element 15 that transmits a signal between the second drive element 14 and the semiconductor control element 11, while providing electrical insulation between the second drive element 14 and the semiconductor control element 11. This configuration can improve the voltage insulation between the input-side circuit, which includes the semiconductor control element 11, and the second output-side circuit, which includes the second drive element 14, in light of a significant potential difference possibly occurring between the second drive element 14 and the semiconductor control element 11. Thus, the semiconductor device A10 is operable with the high side and the low side being interchangeable.

According to this embodiment, in addition, the electroconductive support member 2 includes the first die pad 31, the second die pad 32, the third die pad 33, the input-side terminals 51, the first output-side terminals 52, the second output-side terminals 53 and the pad portions 54 to 56. The input-side terminals 51 are exposed on the side surface 73 of the sealing resin 7, and the first output-side terminals 52 and the second output-side terminals 53 are exposed on the side surface 74 of the sealing resin 7. In contrast, no portion of the electroconductive support member 2 is exposed on the side surfaces 75 and 76 of the sealing resin 7. In other words, although a significant potential difference may occur between the input-side terminals 51 and the first and second output-side terminals 52 and 53, the electroconductive support member 2 has no metallic part exposed from the sealing resin 7 between the input-side terminals 51 and the first and second output-side terminals 52 and 53. This increases the insulation distance between the input-side terminals 51 and the first and second output-side terminals 52 and 53 (the creepage distance along the surface of the sealing resin 7 between the portions of the input-side terminals 51 exposed from the sealing resin 7 and the portions of the first and second output-side terminals 52 and 53 exposed from the sealing resin 7). The semiconductor device A10 can therefore improve the voltage insulation as compared with a configuration in which a portion of the electroconductive support member 2, such as a support lead, is exposed on the side surface 75 or 76.

According to this embodiment, in addition, the sealing resin 7 has a greater surface roughness on the top surface 71, the bottom surface 72 and the upper region 731 and the lower region 732 of the side surface 73 than on the middle region 733 of the side surface 73. Similarly, the sealing resin 7 has a greater surface roughness on the top surface 71, the bottom surface 72 and the upper region 741 and the lower region 742 of the side surface 74 than on the middle region 743 of the side surface 74. This can increase the creepage distance from the input-side terminals 51 to the first output-side terminals 52 along the upper region 731 of the side surface 73, the top surface 71 and the upper region 741 of the side surface 74, as well as the creepage distance from the input-side terminals 51 to the first output-side terminals 52 along the lower region 732 of the side surface 73, the bottom surface 72 and the lower region 742 of the side surface 74. Consequently, the semiconductor device A10 can further improve the voltage insulation.

According to this embodiment, in addition, the first inter-terminal distance L1 (the distance between the portion of first output-side terminal 52a exposed from the sealing resin 7 and the portion of the second output-side terminal 53a exposed from the sealing resin 7) is about 13 times or at least 9 times greater than the second inter-terminal distance L2 (the distance between the portions of two adjacent first output-side terminals 52 exposed from the sealing resin 7). That is, a sufficient separation distance is provided between the exposed portions of the first output-side terminals 52 and the exposed portions of the second output-side terminals 53 in the y direction. Although a significant potential difference may occur between the first output-side terminals 52 and the second output-side terminals 53, the semiconductor device A10 is provided with the sufficient separation distance and therefore ensures high voltage insulation. In addition, the electroconductive support member 2 does not have any portion exposed in the region of the side surface 74 of the sealing resin 7 between the first output-side terminal 52a and the second output-side terminal 53a, and thus no metal part is present in that region. This means that a relatively long insulation distance is provided between the first output-side terminals 52 and the second output-side terminals 53. The semiconductor device A10 can therefore ensure higher voltage insulation as compared with a configuration in which a portion of the electroconductive support member 2, such as a support lead, is exposed on the side surface 74.

According to this embodiment, in addition, the wire 61*a* does not overlap with the first insulating element 13 as viewed in the z direction. That is, the wire 61*a* is prevented from contacting or being too close to the first insulating element 13. Similarly, the wire 61*b* does not overlap with the second insulating element 15 as viewed in the z direction. That is, the wire 61*b* is prevented from contacting or being too close to the second insulating element 15. The wires 61*a* and 61*b* are connected to the semiconductor control element 11 and are components of the input-side circuit, which is held at a relatively low potential. In contrast, the first insulating elements 13 and the second insulating element 15 respectively include portions of the first and second output-side circuits, which are held at a relatively high potential. Preventing the wire 61*a* from being too close to the first insulating element 13 and the wire 61*b* from being too close to the second insulating element 15 serves to improve the voltage insulation of the semiconductor device A10.

Although this embodiment describes the electroconductive support member 2 not exposed on the side surfaces 75 and 76, the present disclosure is not limited to this. The electroconductive support member 2 may include a support lead exposed on the side surface 75 or 76.

In addition, although this embodiment describes the sealing resin 7 having a greater surface roughness on the top surface 71, the bottom surface 72, the upper region 731 and the lower region 732 of the side surface 73 and the upper region 741 and the lower region 742 of the side surface 74 than on the middle region 733 of the side surface 73 and the middle region 743 of the side surface 74, the present disclosure is not limited to this. For example, the sealing resin 7 may have about the same level of surface roughness on each of the surfaces 71 to 76. In such a case, the surface roughness of each of the surfaces 71 to 76 of the sealing resin 7 may be either relatively small or relatively great (e.g., between 5 and 20 μm Rz).

FIGS. 14 to 19 show other embodiments of the present disclosure. In these figures, the elements identical or similar to those of the embodiment described above are denoted by the same reference signs.

Figure 14:
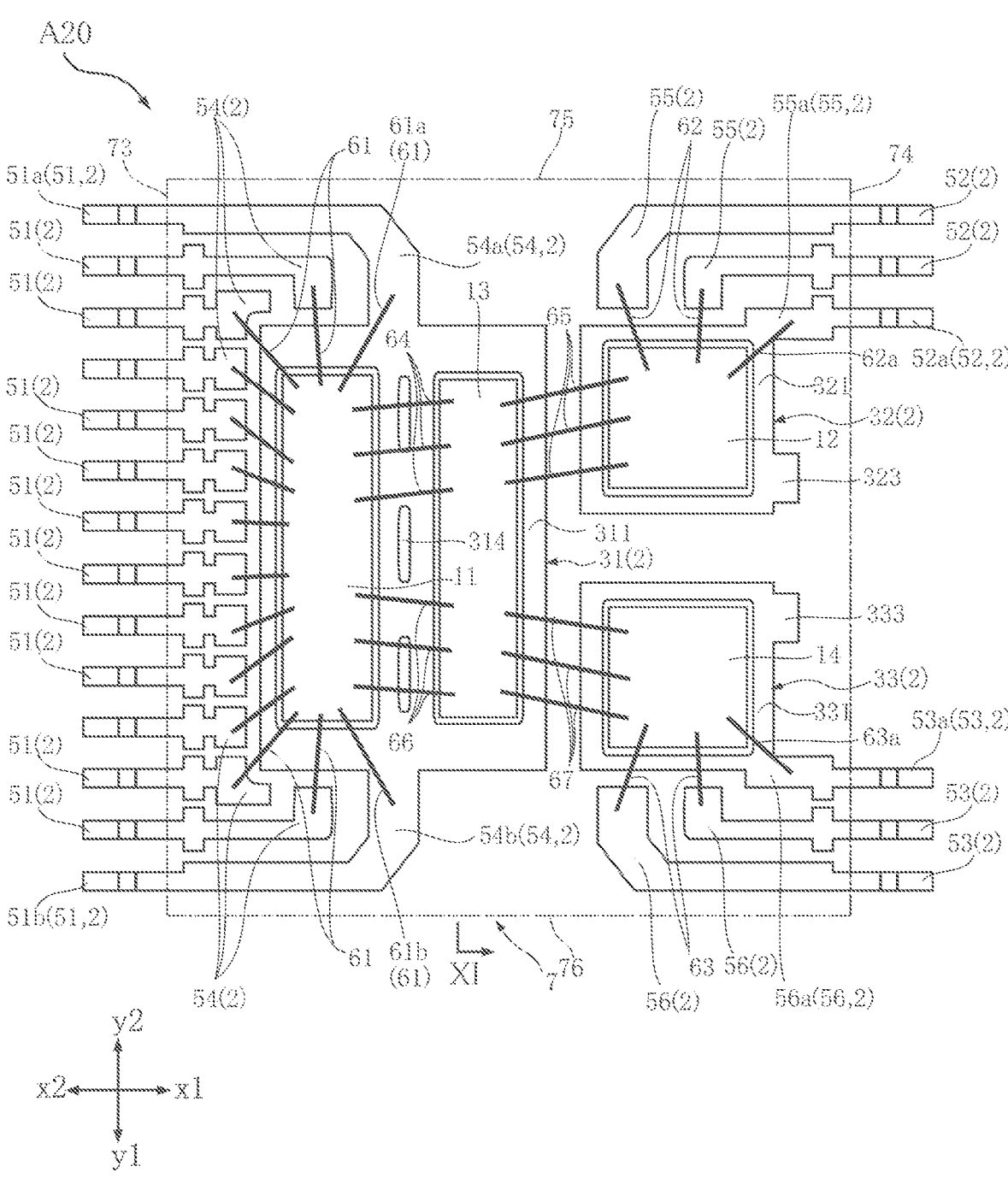
FIG. 14 is a plan view of a semiconductor device according to a second embodiment of the present disclosure, with a sealing resin shown as transparent.

FIG. 14 is a view illustrating a semiconductor device A20 according to a second embodiment of the present disclosure. FIG. 14 is a plan view of the semiconductor device A20 and corresponds to FIG. 2. For convenience, FIG. 14 shows the sealing resin 7 as transparent and shows the outline of the sealing resin 7 in imaginary lines (dash-double dot lines). The semiconductor device A20 of this embodiment differs from the first embodiment in that the second insulating element 15 is omitted and that the first insulating element 13 relays a signal transmitted between the second drive element 14 and the semiconductor control element 11.

The semiconductor device A20 according to this embodiment does not include the second insulating element 15. In this embodiment, the first insulating element 13 additionally provides a signal transmission between the second drive element 14 and the semiconductor control element 11, while also providing electrical insulation between the second drive element 14 and the semiconductor control element 11.

Also in this embodiment, the semiconductor device A20 includes the semiconductor control element 11, the first drive element 12 and the second drive element 14 and thus is capable of driving two switching elements of a half-bridge circuit. The semiconductor device A20 can be more compact than two conventional semiconductor devices together and can therefore reduce the footprint on the wiring board of an inverter device. In addition, the footprint of the semiconductor device A20 can be further reduced as the spacing required between two conventional semiconductor devices when they are mounted on a wiring board of the semiconductor is not necessary. According to this embodiment, in addition, the semiconductor device A20 includes the first insulating element 13 that provides a signal transmission and electrical insulation between the first drive element 12 and the semiconductor control element 11 as well as between the second drive element 14 and the semiconductor control element 11. This configuration can improve the voltage insulation between the input-side circuit, which includes the semiconductor control element 11, and the first output-side circuit, which includes the first drive element 12, as well as between the input-side circuit and the second output-side circuit, which includes the second drive element 14. Also, the semiconductor device A20 is operable with the high side and the low side being interchangeable. In addition, the semiconductor device A20 includes the same configuration as that of the semiconductor device A10 and can therefore achieve the same advantages as the semiconductor device A10.

Figure 15:
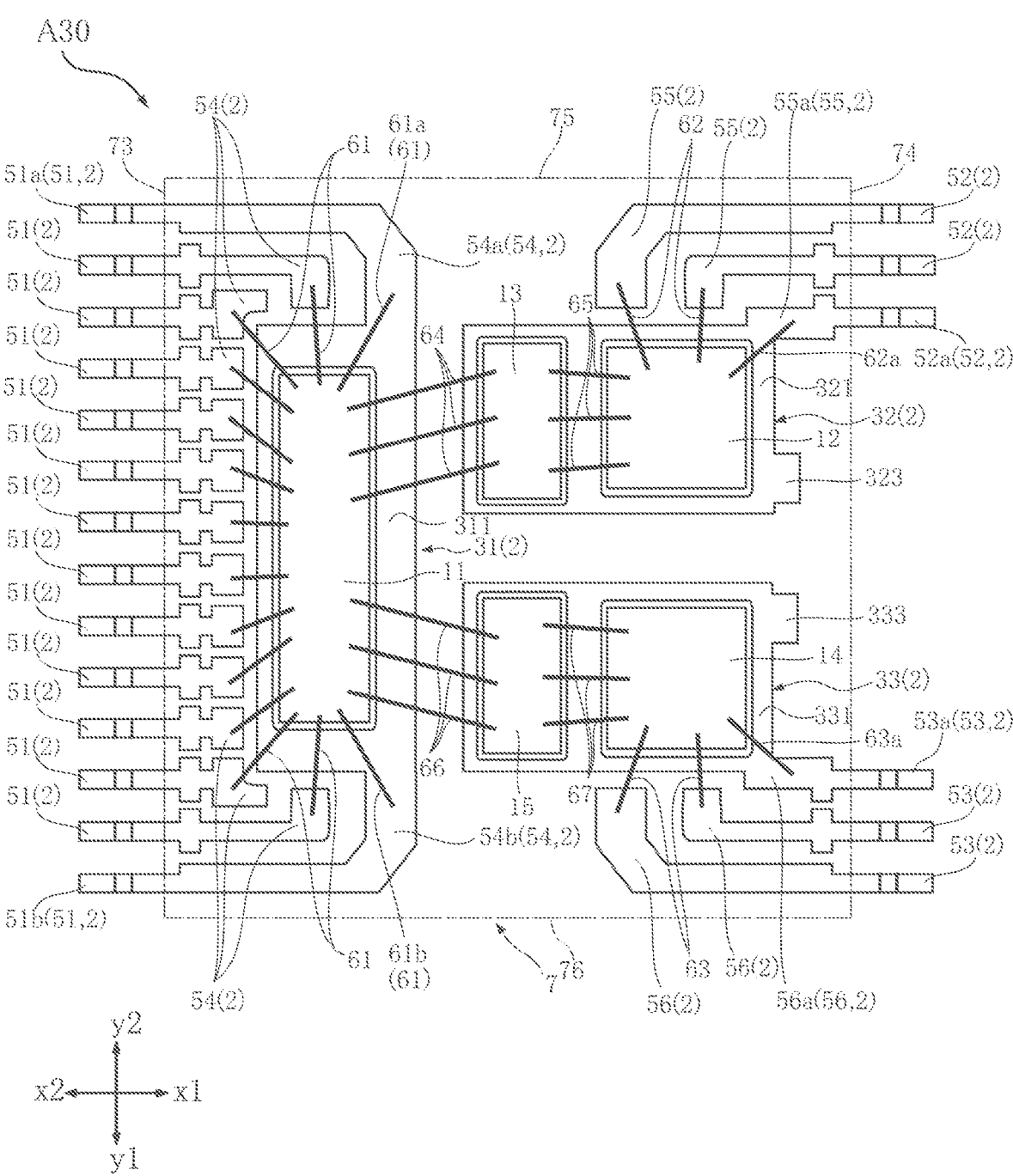
FIG. 15 is a plan view of a semiconductor device according to a third embodiment of the present disclosure, with a sealing resin shown as transparent.

FIG. 15 is a view illustrating a semiconductor device A30 according to a third embodiment of the present disclosure. FIG. 15 is a plan view of the semiconductor device A30 and corresponds to FIG. 2. For convenience, FIG. 15 shows the sealing resin 7 as transparent and shows the outline of the sealing resin 7 in imaginary lines (dash-double dot lines). The semiconductor device A30 of this embodiment differs from the first embodiment in that the first insulating element 13 is mounted on the second die pad 32, and the second insulating element 15 is mounted on the third die pad 33.

The first die pad 31 of this embodiment has a smaller x-direction dimension than that of the first embodiment. In contrast, the second die pad 32 and the third die pad 33 have greater x-direction dimensions than those of the first embodiment. In this embodiment, the first insulating element 13 is mounted on the second die pad 32, and the second insulating element 15 is mounted on the third die pad 33.

Also in this embodiment, the semiconductor device A30 includes the semiconductor control element 11, the first drive element 12 and the second drive element 14 and thus is capable of driving two switching elements of a half-bridge circuit. The semiconductor device A30 can be more compact than two conventional semiconductor devices together and can therefore reduce the footprint on the wiring board of an inverter device. In addition, the footprint of the semiconductor device A30 can be further reduced as the spacing required between two conventional semiconductor devices when they are mounted on a wiring board of the semiconductor is not necessary. In addition, the semiconductor device A30 includes the same configuration as that of the semiconductor device A10 and can therefore achieve the same advantages as the semiconductor device A10.

Figure 16:
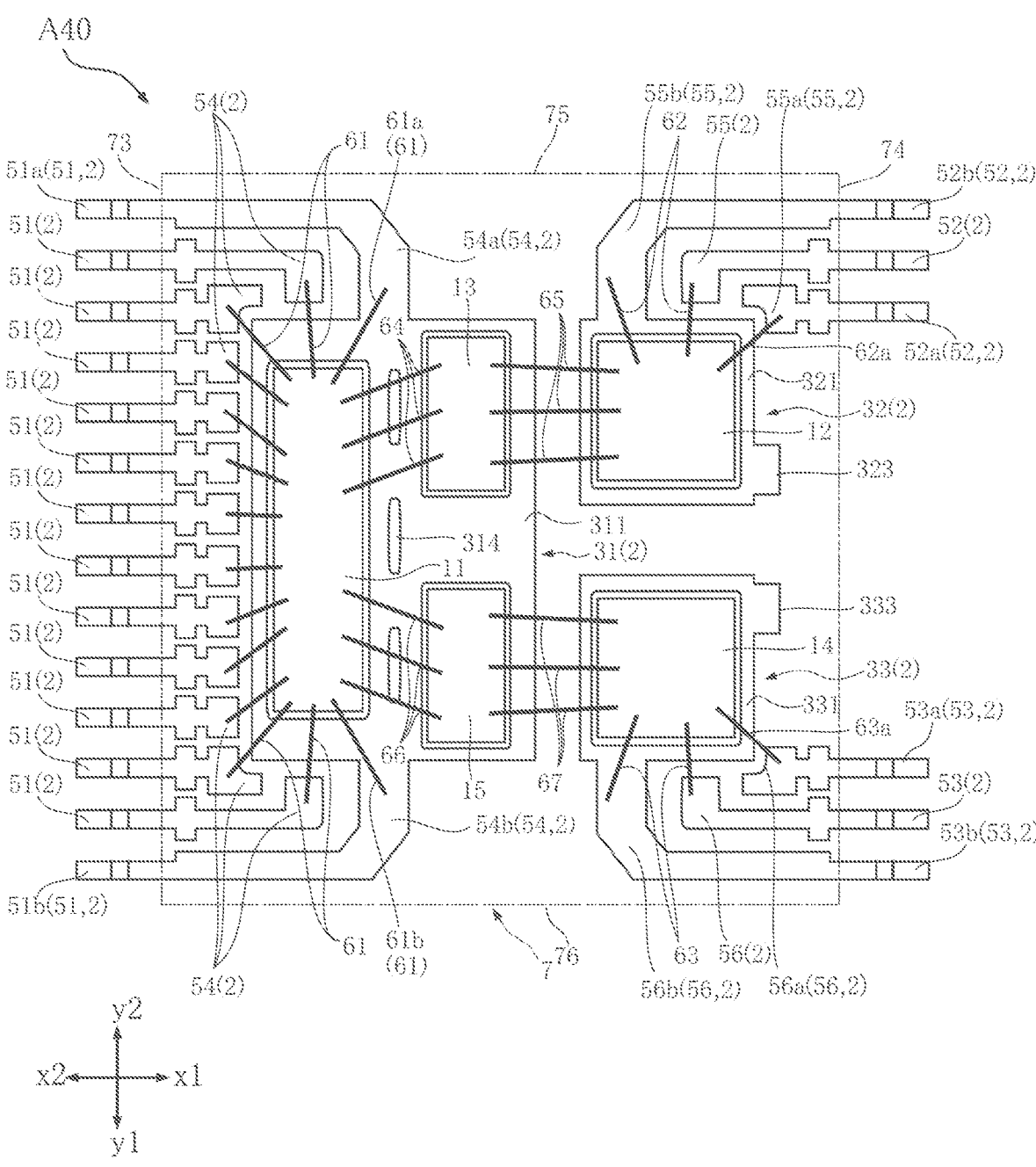
FIG. 16 is a plan view of a semiconductor device according to a fourth embodiment of the present disclosure, with a sealing resin shown as transparent.

FIG. 16 is a view illustrating a semiconductor device A40 according to a fourth embodiment of the present disclosure. FIG. 16 is a plan view of the semiconductor device A40 and corresponds to FIG. 2. For convenience, FIG. 16 shows the sealing resin 7 as transparent and shows the outline of the sealing resin 7 in imaginary lines (dash-double dot lines). The semiconductor device A40 of this embodiment differs from the first embodiment in that the second die pad 32 and the third die pad 33 are supported by different support terminals.

According to this this embodiment, the pad portion 55*a* is not connected to the second die pad 32, and the pad portion 56*a* is not connected to the third die pad 33.

The plurality of first output-side terminal 52 of this embodiment include a first output-side terminal 52b. The first output-side terminal 52b is located farthest on the y2 side in the y direction among the first output-side terminals 52. In other words, the first output-side terminal 52b is located farthest from the second output-side terminals 53. The plurality of pad portions 55 include a pad portion 55b. The pad portion 55b is connected to the first output-side terminal 52b. The pad portion 55b extends in the y direction to be connected to the second die pad 32 at the end on the y1 side in the y direction. That is, the first output-side terminal 52b is connected via the pad portion 55b to the second die pad 32 and supports the second die pad 32.

In addition, the plurality of second output-side terminals 53 include a second output-side terminal 53b. The second output-side terminal 53b is located farthest on the y1 side in the y direction among the second output-side terminals 53. In other words, the second output-side terminal 53b is located farthest from the first output-side terminals 52. The plurality of pad portions 56 include a pad portion 56b. The pad portion 56b is connected to the second output-side terminal 53b. The pad portion 56b extends in the y direction to be connected to the third die pad 33 at the end on the y2 side in the y direction. That is, the second output-side terminal 53b is connected via the pad portion 56b to the third die pad 33 and supports the third die pad 33.

Also in this embodiment, the semiconductor device A40 includes the semiconductor control element 11, the first drive element 12 and the second drive element 14 and thus is capable of driving two switching elements of a half-bridge circuit. The semiconductor device A40 can be more compact than two conventional semiconductor devices together and can therefore reduce the footprint on the wiring board of an inverter device. In addition, the footprint of the semiconductor device A40 can be further reduced as the spacing required between two conventional semiconductor devices when they are mounted on a wiring board of the semiconductor is not necessary. In addition, the semiconductor device A40 includes the same configuration as that of the semiconductor device A10 and can therefore achieve the same advantages as the semiconductor device A10.

Figure 17:
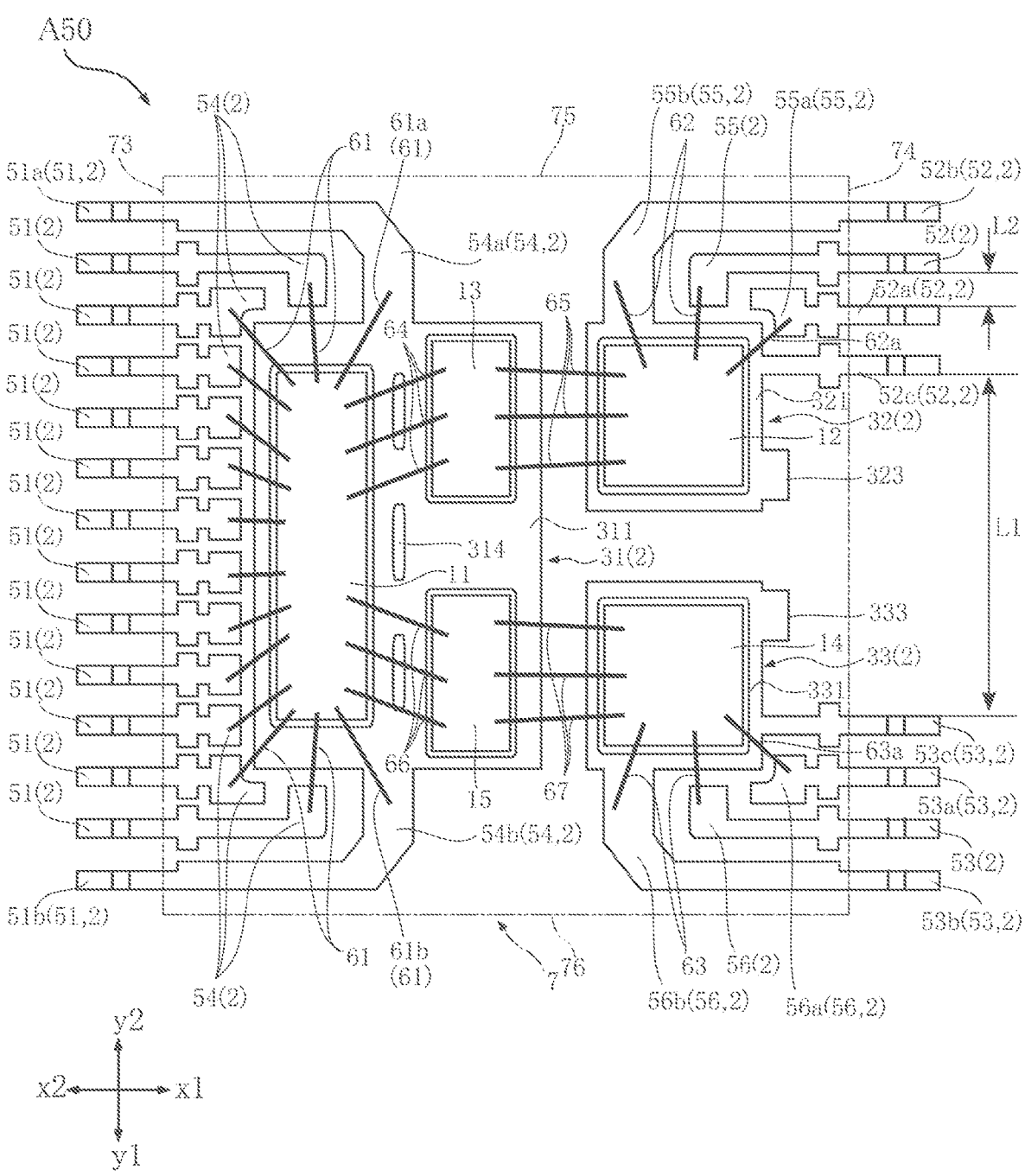
FIG. 17 is a plan view of a semiconductor device according to a fifth embodiment of the present disclosure, with a sealing resin shown as transparent.

FIG. 17 is a view illustrating a semiconductor device A50 according to a fifth embodiment of the present disclosure. FIG. 17 is a plan view of the semiconductor device A50 and corresponds to FIG. 2. For convenience, FIG. 17 shows sealing resin 7 as transparent and shows the outline of the sealing resin 7 in imaginary lines (dash-double dot lines). The semiconductor device A50 of this embodiment differs from the first embodiment in that the second die pad 32 and the third die pad 33 are each supported by two terminals.

This embodiment is similar to the fourth embodiment in that the pad portion 55a is not connected to the second die pad 32 and that the pad portion 56a is not connected to the third die pad 33. Also, the second die pad 32 is supported by the first output-side terminal 52b via the pad portion 55b, and the third die pad 33 is supported by the second output-side terminal 53b via the pad portion 56b.

The plurality of first output-side terminals 52 of this embodiment additionally include a first output-side terminal 52c. The first output-side terminal 52c is located on the y1 side in the y direction with respect to the first output-side terminal 52a. That is, among the first output-side terminal 52 of this embodiment, the first output-side terminal 52c is located farthest on the y1 side in the y direction and hence closest to the second output-side terminals 53. The first output-side terminal 52c is connected to the second die pad 32 at the end on the x2 side in the x direction and supports the second die pad 32. That is, the second die pad 32 is supported by two terminals, namely the first output-side terminals 52b and 52c.

Also, the second output-side terminals 53 of this embodiment additionally include a second output-side terminal 53c. The second output-side terminal 53c is located on the y2 side in the y direction with respect to the second output-side terminal 53a. That is, among the second output-side terminals 53 of this embodiment, the second output-side terminal 53c is located farthest on the y2 side in the y direction and hence closest to the first output-side terminals 52. The second output-side terminal 53c is connected to the third die pad 33 at the end on the x2 side in the x direction and supports the third die pad 33. That is, the third die pad 33 is supported by two terminals, namely the second output-side terminals 53b and 53c.

In this embodiment, the first inter-terminal distance L1 (the distance between the portion of the first output-side terminal 52c exposed from the sealing resin 7 and the portion of the second output-side terminal 53c exposed from the sealing resin 7) is shorter than in the first embodiment. This first inter-terminal distance L1, however, is about ten times greater or at least nine times greater than the second inter-terminal distance L2 (the distance between the portions of two adjacent first output-side terminals 52 exposed from the sealing resin 7).

Also in this embodiment, the semiconductor device A50 includes the semiconductor control element 11, the first drive element 12 and the second drive element 14 and thus is capable of driving two switching elements of a half-bridge circuit. The semiconductor device A50 can be more compact than two conventional semiconductor devices together and can therefore reduce the footprint on the wiring board of an inverter device. In addition, the footprint of the semiconductor device A50 can be further reduced as the spacing required between two conventional semiconductor devices when they are mounted on a wiring board of the semiconductor is not necessary. In addition, the first inter-terminal distance L1 of this embodiment is about ten times or at least nine times greater than the second inter-terminal distance L2. With the sufficient separation distance provided between the portions of the first output-side terminals 52 exposed from the sealing resin 7 and the portions of the second output-side terminals 53 exposed from the sealing resin 7 in the y direction, the semiconductor device A50 can ensure high voltage insulation. In addition, the semiconductor device A50 includes the same configuration as that of the semiconductor device A10 and can therefore achieve the same advantages as the semiconductor device A10.

According to this embodiment, in addition, the second die pad 32 is supported by two terminals, namely the first output-side terminals 52b and 52c. Hence, the second die pad 32 can be held more stable during the process of bonding the first drive element 12 to the second die pad 32 and also during the process of forming the wires 62. The third die pad 33 is also supported by two terminals, namely the second output-side terminals 53b and 53c. Hence, the third die pad 33 can be held more stable during the process of bonding the second drive element 14 to the third die pad 33 and also during the process of forming the wires 63.

Figure 18:
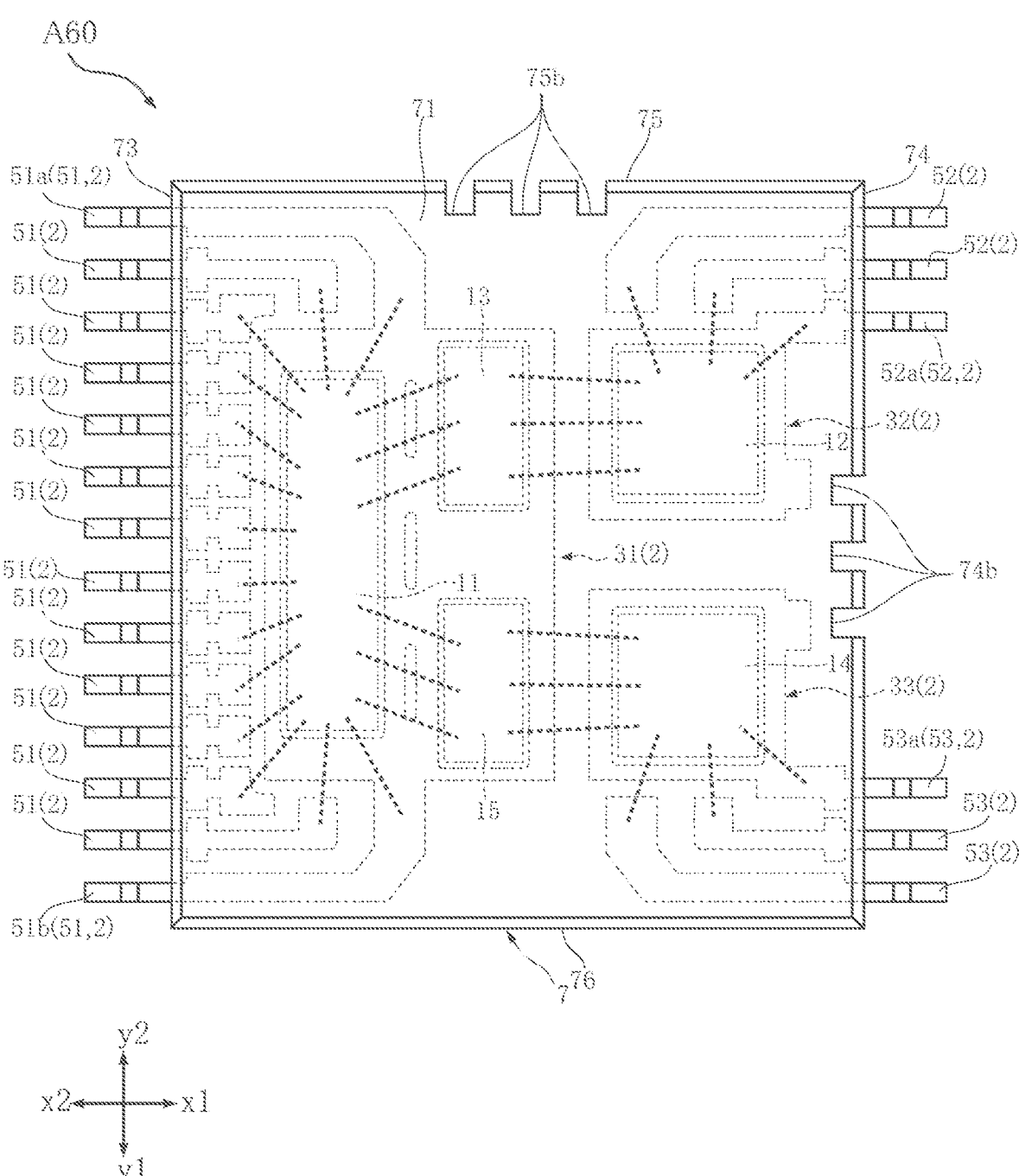
FIG. 18 is a plan view of a semiconductor device according to a sixth embodiment of the present disclosure.

FIG. 18 is a view illustrating a semiconductor device A60 according to a sixth embodiment of the present disclosure. FIG. 18 is a plan view of the semiconductor device A60 and corresponds to FIG. 1. The semiconductor device A60 of this embodiment differs from the first embodiment in that the sealing resin 7 is formed with a groove.

The sealing resin 7 of this embodiment additionally includes a first groove 74b and a second groove 75b. The first groove 74b is recessed from the side surface 74 in the x direction and extends in z direction from the top surface 71 to the bottom surface 72. The sealing resin 7 of this embodiment includes, but not limited to, three first grooves 74b at equal intervals in the y direction. The first grooves 74b are rectangular as viewed in the z direction. The shape of each first groove 74b as viewed in the z direction is not limited to this and may be semi-circular, for example. The first grooves 74b are located in a region of the side surface 74 between the first output-side terminal 52a and the second output-side terminal 53a. The second groove 75b is recessed from the side surface 75 in the y direction and extends in z direction from the top surface 71 to the bottom surface 72. The sealing resin 7 of this embodiment includes three second grooves 75b at equal intervals in the x direction. The number and locations of the second grooves 75b to be provided are not specifically limited. The second grooves 75b are rectangular as viewed in the z direction. The shape of each second groove 75b as viewed in the z direction is not limited to this and may be semi-circular, for example. The sealing resin 7 may additionally include one or more third grooves recessed from the side surface 76 in the y direction and extending in the z direction from the top surface 71 to the bottom surface 72.

Also in this embodiment, the semiconductor device A60 includes the semiconductor control element 11, the first drive element 12 and the second drive element 14 and thus is capable of driving two switching elements of a half-bridge circuit. The semiconductor device A60 can be more compact than two conventional semiconductor devices together and can therefore reduce the footprint on the wiring board of an inverter device. In addition, the footprint of the semiconductor device A60 can be further reduced as the spacing required between two conventional semiconductor devices when they are mounted on a wiring board of the semiconductor is not necessary. In addition, the semiconductor device A60 includes the same configuration as that of the semiconductor device A10 and can therefore achieve the same advantages as the semiconductor device A10.

According to this embodiment, in addition, the sealing resin 7 includes the first grooves 74b in a region of the side surface 74 between the first output-side terminal 52a and the second output-side terminal 53a. The creepage distance from the first output-side terminal 52a to the second output-side terminal 53a along the side surface 74 is greater with the first grooves 74b than without. Consequently, the semiconductor device A60 can further improve the voltage insulation. According to this embodiment, in addition, the sealing resin 7 includes the second grooves 75b on the side surface 75. The creepage distance from the input-side terminal 51a to the first output-side terminals 52 along the side surfaces 73, 75 and 74 of the sealing resin 7 is greater with the second grooves 75b than without. Consequently, the semiconductor device A60 can further improve the voltage insulation.

Figure 19:
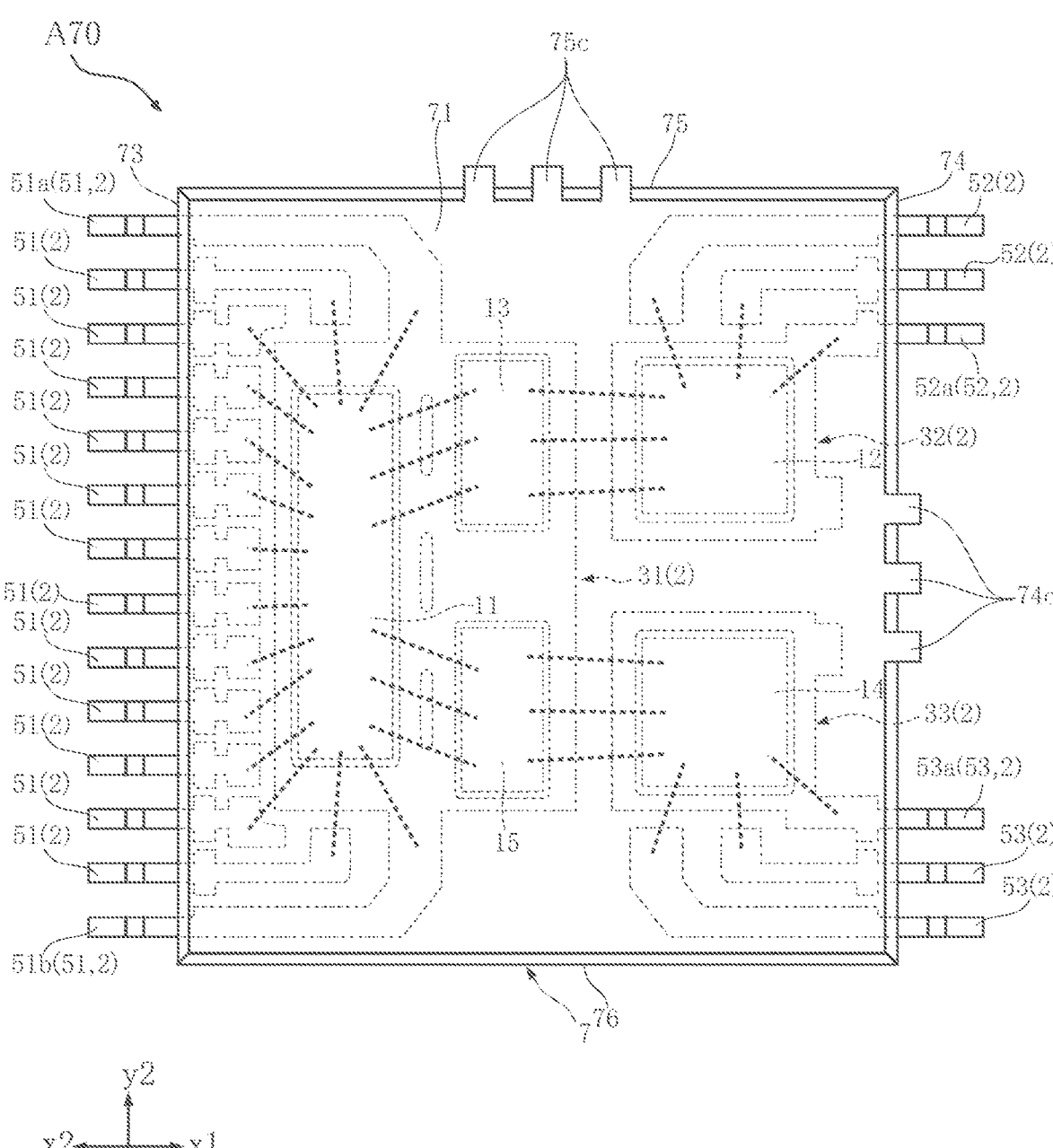
FIG. 19 is a plan view of a semiconductor device according to a seventh embodiment of the present disclosure.

FIG. 19 is a view illustrating a semiconductor device A70 according to a seventh embodiment of the present disclosure. FIG. 19 is a plan view of the semiconductor device A70 and corresponds to FIG. 1. The semiconductor device A70 of this embodiment differs from the first embodiment in that the sealing resin 7 is formed with a protrusion.

The sealing resin 7 of this embodiment includes a first protrusion 74c and a second protrusion 75c. The first protrusion 74c protrudes from the side surface 74 in the x direction and extends in z direction from the top surface 71 to the bottom surface 72. The sealing resin 7 of this embodiment includes, but not limited to, three first protrusions 74c at equal intervals in the y direction. The first protrusions 74c are rectangular as viewed in the z direction. The shape of each first protrusion 74c as viewed in the z direction is not limited to this and may be semi-circular, for example. The first protrusions 74c are located in a region of the side surface 74 between the first output-side terminal 52a and the second output-side terminal 53a. The second protrusion 75c protrudes from the side surface 75 in the y direction and extends in z direction from the top surface 71 to the bottom surface 72. The sealing resin 7 of this embodiment includes three second protrusions 75c at equal intervals in the x direction. The number and the locations of the second protrusions 75c to be provided are not limited. The second protrusions 75c are rectangular as viewed in the z direction. The shape of each second protrusion 75c as viewed in the z direction is not limited to this and may be semi-circular, for example. The sealing resin 7 may additionally include one or more third protrusions protruding from the side surface 76 in the y direction and extending in the z direction from the top surface 71 to the bottom surface 72.

Also in this embodiment, the semiconductor device A70 includes the semiconductor control element 11, the first drive element 12 and the second drive element 14 and thus is capable of driving two switching elements of a half-bridge circuit. The semiconductor device A70 can be more compact than two conventional semiconductor devices together and can therefore reduce the footprint on the wiring board of an inverter device. In addition, the footprint of the semiconductor device A70 can be further reduced as the spacing required between two conventional semiconductor devices when they are mounted on a wiring board of the semiconductor is not necessary. In addition, the semiconductor device A70 includes the same configuration as that of the semiconductor device A10 and can therefore achieve the same advantages as the semiconductor device A10.

According to this embodiment, in addition, the sealing resin 7 includes the first protrusions 74c in a region of the side surface 74 between the first output-side terminal 52a and the second output-side terminal 53a. The creepage distance from the first output-side terminal 52a to the second output-side terminal 53a along the side surface 74 is greater with the first protrusions 74c than without. Consequently, the semiconductor device A70 can further improve the voltage insulation. In addition, the sealing resin 7 includes the second protrusions 75c on the side surface 75. The creepage distance from the input-side terminal 51a to the first output-side terminals 52 along the side surfaces 73, 75 and 74 of the sealing resin 7 is greater with the second protrusions 75c than without. Consequently, the semiconductor device A70 can further improve the voltage insulation.

The semiconductor device according to the present disclosure is not limited to the foregoing embodiments. Various design changes can be made to the specific configuration of each part of the semiconductor device according to present disclosure. The present disclosure covers the embodiments described in the following clauses.

Clause 1.

A semiconductor device comprising:

a semiconductor control element;

a first drive element spaced apart from the semiconductor control element in a first direction orthogonal to a thickness direction of the semiconductor control element, the first drive element receiving a signal transmitted from the semiconductor control element;

a second drive element located on a same side as the first drive element in the first direction with respect to the semiconductor control element and on a first side in a second direction orthogonal to the thickness direction and the first direction with respect to the first drive element, the second drive element receiving a signal transmitted from the semiconductor control element;

a first insulating element located between the semiconductor control element and the first drive element in the first direction, the first insulating element relaying a signal transmitted from the semiconductor control element to the first drive element and providing electrical insulation between the semiconductor control element and the first drive element; and a sealing resin covering the semiconductor control element.

Clause 2.

The semiconductor device according to Clause 1, further comprising an electroconductive support member including a first die pad on which the semiconductor control element is mounted, a second die pad on which the first drive element is mounted, and a third die pad on which the second drive element is mounted.

Clause 3.

The semiconductor device according to Clause 2, further comprising a second insulating element located between the semiconductor control element and the second drive element in the first direction, the second insulating element relaying a signal transmitted from the semiconductor control element to the second drive element and providing electrical insulation between the semiconductor control element and the second drive element.

Clause 4.

The semiconductor device according to Clause 3, wherein the first insulating element and the second insulating element are mounted on the first die pad.

Clause 5.

The semiconductor device according to Clause 3, wherein the first insulating element is mounted on the second die pad, and the second insulating element is mounted on the third die pad.

Clause 6.

The semiconductor device according to Clause 2, wherein the first insulating element relays a signal transmitted from the semiconductor control element to the second drive element and provides electrical insulation between the semiconductor control element and the second drive element.

Clause 7.

The semiconductor device according to Clause 6, wherein the first insulating element is mounted on the first die pad.

Clause 8.

The semiconductor device according to any one of Clauses 2 to 7, wherein the electroconductive support member includes a plurality of input-side terminals arranged side by side in the second direction, and at least one of the plurality of input-side terminals is electrically connected to the semiconductor control element.

Clause 9.

The semiconductor device according to Clause 8, wherein the plurality of input-side terminals includes an input-side first support terminal and an input-side second support terminal each connected to the first die pad, and the input-side first support terminal and the input-side second support terminal are most distant from each other in the second direction among the plurality of input-side terminals.

Clause 10.

The semiconductor device according to Clause 8 or 9, wherein the electroconductive support member includes:

a plurality of first output-side terminals arranged side by side in the second direction, at least one of the plurality of first output-side terminals being electrically connected to the first drive element; and a plurality of second output-side terminals arranged side by side in the second direction, at least one of the plurality of second output-side terminals being electrically connected to the second drive element.

Clause 11.

The semiconductor device according to Clause 10, wherein the plurality of first output-side terminals includes a single first output-side support terminal connected to the second die pad, and the plurality of second output-side terminals includes a single second output-side support terminal connected to the third die pad.

Clause 12.

The semiconductor device according to Clause 11, wherein the first output-side support terminal is located closest to the plurality of second output-side terminals among the plurality of first output-side terminals, and the second output-side support terminal is located closest to the plurality of first output-side terminals among the plurality of second output-side terminals.

Clause 13.

The semiconductor device according to Clause 11, wherein the first output-side support terminal is located farthest from the plurality of second output-side terminals among the plurality of first output-side terminals, and the second output-side support terminal is located farthest from the plurality of first output-side terminals among the plurality of second output-side terminals.

Clause 14.

The semiconductor device according to Clause 10, wherein the plurality of first output-side terminals include a first output-side innermost terminal located closest to the plurality of second output-side terminals, the plurality of second output-side terminals include a second output-side innermost terminal located closest to the plurality of first output-side terminals, and the first output-side innermost terminal and the second output-side innermost terminal include portions exposed from the sealing resin that are spaced apart from each other by a first inter-terminal distance, and two adjacent first output-side terminals that are most distant from each other among the plurality of first output-side include portions exposed from the sealing resin that are spaced apart from each other by a second inter-terminal distance, the first inter-terminal distance being at least three times greater than the second inter-terminal distance.

Clause 15.

The semiconductor device according to Clause 14, wherein the first inter-terminal distance is at least nine times greater than the second inter-terminal distance.

Clause 16.

The semiconductor device according to Clause 14 or 15, wherein the sealing resin includes a first side surface on a same side as the first drive element in the first direction with respect to the semiconductor control element, and

the electroconductive support member is not exposed in a region of the first side surface between the first output-side innermost terminal and the second output-side innermost terminal.

Clause 17.

The semiconductor device according to Clause 16, wherein the sealing resin includes a first groove recessed from the first side surface in the first direction and extending in the thickness direction.

Clause 18.

The semiconductor device according to any one of Clauses 2 to 17, wherein the sealing resin includes a second side surface on a second side opposite the first side in the second direction, and the electroconductive support member is not exposed on the second side surface.

Clause 19.

The semiconductor device according to Clause 18, wherein the sealing resin includes a second groove recessed from the second side surface in the second direction and extending in the thickness direction.

REFERENCE NUMERALS

| | |
|---|---|
| A10, A20, A30, A40: Semiconductor device | |
| A50, A60, A70: Semiconductor device | |
| 11: Semiconductor control element | 12: First drive element |
| 13: First insulating element | 14: Second drive element |
| 15: Second insulating element | |
| 2: Electroconductive support member | |
| 31: First die pad | 311: Obverse surface |
| 312: Reverse surface | 314: Groove |
| 32: Second die pad | 321: Obverse surface |
| 322: Reverse surface | 323: Protrusion |
| 33: Third die pad | 331: Obverse surface |
| 332: Reverse surface | 333: Protrusion |
| 51, 51a, 51b: Input-side terminal | |
| 52, 52a, 52b, 52c: First output-side terminal | |
| 53, 53a, 53b, 53c: Second output-side terminal | |
| 54, 54a, 54b, 55, 55a, 55b: Pad portion | |
| 56, 56a, 56b: Pad portion | |
| 61, 61a, 61b, 62, 62a: Wire | |
| 63, 63a, 64 to 67: Wire | |
| 69: Bonding layer | 7: Sealing resin |
| 71: Top surface | 72: Bottom surface |
| 73: Side surface | 731: Upper region |
| 732: Lower region | 733: Middle region |
| 74: Side surface | 741: Upper region |
| 742: Lower region | 743: Middle region |
| 74b: First groove | 74c: First protrusion |
| 75: Side surface | 751: Upper region |
| 752: Lower region | 753: Middle region |
| 75b: Second groove | 75c: Second protrusion |
| 76: Side surface | 761: Upper region |
| 762: Lower region | 763: Middle region |
| 80: Leadframe | 80A: Obverse surface |
| 80B: Reverse surface | 81: Frame |
| 82: Tie bar | 83: Dam bar |

The invention claimed is:

1. A semiconductor device comprising:
a semiconductor control element;
a first drive element spaced apart from the semiconductor control element in a first direction orthogonal to a thickness direction of the semiconductor control element, the first drive element receiving a signal transmitted from the semiconductor control element;
a second drive element located on a same side as the first drive element in the first direction with respect to the semiconductor control element and on a first side in a second direction orthogonal to the thickness direction and the first direction with respect to the first drive element, the second drive element receiving a signal transmitted from the semiconductor control element;
a first insulating element located between the semiconductor control element and the first drive element in the first direction, the first insulating element relaying a signal transmitted from the semiconductor control element to the first drive element and providing electrical insulation between the semiconductor control element and the first drive element;
a second insulating element located between the semiconductor control element and the second drive element in the first direction, the second insulating element relaying a signal transmitted from the semiconductor control element to the second drive element and providing electrical insulation between the semiconductor control element and the second drive element;
a sealing resin covering the semiconductor control element; and
an electroconductive support member including a first die pad on which the semiconductor control element, the first insulating element and the second insulating element are mounted, a second die pad on which the first drive element is mounted, and a third die pad on which the second drive element is mounted.

2. The semiconductor device according to claim 1, wherein the electroconductive support member includes a plurality of input-side terminals arranged side by side in the second direction, and at least one of the plurality of input-side terminals is electrically connected to the semiconductor control element.

3. The semiconductor device according to claim 2, wherein the plurality of input-side terminals includes an input-side first support terminal and an input-side second support terminal each connected to the first die pad, and
the input-side first support terminal and the input-side second support terminal are most distant from each other in the second direction among the plurality of input-side terminals.

4. The semiconductor device according to claim 2, wherein the electroconductive support member includes:
a plurality of first output-side terminals arranged side by side in the second direction, at least one of the plurality of first output-side terminals being electrically connected to the first drive element; and
a plurality of second output-side terminals arranged side by side in the second direction, at least one of the plurality of second output-side terminals being electrically connected to the second drive element.

5. The semiconductor device according to claim 4, wherein the plurality of first output-side terminals includes a single first output-side support terminal connected to the second die pad, and
the plurality of second output-side terminals includes a single second output-side support terminal connected to the third die pad.

6. The semiconductor device according to claim 5, wherein the first output-side support terminal is located closest to the plurality of second output-side terminals among the plurality of first output-side terminals, and
the second output-side support terminal is located closest to the plurality of first output-side terminals among the plurality of second output-side terminals.

7. The semiconductor device according to claim 5, wherein the first output-side support terminal is located farthest from the plurality of second output-side terminals among the plurality of first output-side terminals, and the second output-side support terminal is located farthest from the plurality of first output-side terminals among the plurality of second output-side terminals.

8. The semiconductor device according to claim 4, wherein the plurality of first output-side terminals include a first output-side innermost terminal located closest to the plurality of second output-side terminals, the plurality of second output-side terminals include a second output-side innermost terminal located closest to the plurality of first output-side terminals, and the first output-side innermost terminal and the second output-side innermost terminal include portions exposed from the sealing resin that are spaced apart from each other by a first inter-terminal distance, and two adjacent first output-side terminals that are most distant from each other among the plurality of first output-side terminals include portions exposed from the sealing resin that are spaced apart from each other by a second inter-terminal distance, the first inter-terminal distance being at least three times greater than the second inter-terminal distance.

9. The semiconductor device according to claim 8, wherein the first inter-terminal distance is at least nine times greater than the second inter-terminal distance.

10. The semiconductor device according to claim 8, wherein the sealing resin includes a first side surface on a same side as the first drive element in the first direction with respect to the semiconductor control element, and the electroconductive support member is not exposed in a region of the first side surface between the first output-side innermost terminal and the second output-side innermost terminal.

11. The semiconductor device according to claim 10, wherein the sealing resin includes a first groove recessed from the first side surface in the first direction and extending in the thickness direction.

12. The semiconductor device according to claim 1, wherein the sealing resin includes a second side surface on a second side opposite the first side in the second direction, and the electroconductive support member is not exposed on the second side surface.

13. The semiconductor device according to claim 12, wherein the sealing resin further includes a second groove recessed from the second side surface in the second direction and extending in the thickness direction.

14. The semiconductor device according to claim 1, wherein the first insulating element and the second insulating element are of an inductive-coupling type or of a capacitive type.

15. A semiconductor device comprising:

a semiconductor control element;

a first drive element spaced apart from the semiconductor control element in a first direction orthogonal to a thickness direction of the semiconductor control element, the first drive element receiving a signal transmitted from the semiconductor control element;

a second drive element located on a same side as the first drive element in the first direction with respect to the semiconductor control element and on a first side in a second direction orthogonal to the thickness direction and the first direction with respect to the first drive element, the second drive element receiving a signal transmitted from the semiconductor control element;

a first insulating element located between the semiconductor control element and the first drive element in the first direction, the first insulating element relaying a signal transmitted from the semiconductor control element to the first drive element and providing electrical insulation between the semiconductor control element and the first drive element;

a sealing resin covering the semiconductor control element; and an electroconductive support member including a first die pad on which the semiconductor control element is mounted, a second die pad on which the first drive element is mounted, and a third die pad on which the second drive element is mounted, wherein the first insulating element further relays a signal transmitted from the semiconductor control element to the second drive element and provides electrical insulation between the semiconductor control element and the second drive element.

16. The semiconductor device according to claim 15, wherein the first insulating element is mounted on the first die pad.

* * * * *